(12) United States Patent
Lowe et al.

(10) Patent No.: US 11,618,191 B2
(45) Date of Patent: *Apr. 4, 2023

(54) DI METAL TRANSACTION DEVICES AND PROCESSES FOR THE MANUFACTURE THEREOF

(71) Applicant: CompoSecure, LLC, Somerset, NJ (US)

(72) Inventors: Adam Lowe, Somerset, NJ (US); John Esau, Marlboro, NJ (US)

(73) Assignee: CompoSecure, LLC, Somerset, NJ (US)

( * ) Notice: Subject to any disclaimer, the term of this patent is extended or adjusted under 35 U.S.C. 154(b) by 195 days.

This patent is subject to a terminal disclaimer.

(21) Appl. No.: 17/168,382

(22) Filed: Feb. 5, 2021

(65) Prior Publication Data

US 2021/0154898 A1 May 27, 2021

Related U.S. Application Data

(63) Continuation-in-part of application No. 16/983,395, filed on Aug. 3, 2020, now Pat. No. 11,301,743, and
(Continued)

(51) Int. Cl.
*B29C 45/14* (2006.01)
*G06K 19/077* (2006.01)
(Continued)

(52) U.S. Cl.
CPC ........ *B29C 45/14647* (2013.01); *B22D 19/00* (2013.01); *B29C 45/14* (2013.01);
(Continued)

(58) Field of Classification Search
CPC .............. B29C 45/14647; B29C 45/14; B29C 45/14639; B29C 45/17; B22D 19/00;
(Continued)

(56) References Cited

U.S. PATENT DOCUMENTS 3,802,101 A 4/1974 Scantlin
4,737,620 A 4/1988 Mollet et al.
(Continued)

FOREIGN PATENT DOCUMENTS

CA 2347818 A1 5/2000
CA 2860909 A1 8/2013
(Continued)

OTHER PUBLICATIONS

Final Office Action for U.S. Appl. No. 17/128,427, dated Oct. 5, 2021, 16 pages.
(Continued)

*Primary Examiner* — Edwyn Labaze
(74) *Attorney, Agent, or Firm* — RatnerPrestia

(57) ABSTRACT

A transaction device includes a metal layer with one or more discontinuities in the metal layer. Each discontinuity comprises a gap in the metal layer extending from the front surface to the back surface, including at least one discontinuity that defines a path from the device periphery to the opening. A transponder chip module is disposed in the opening. A booster antenna is in communication with the transponder chip module. The device may include at least one fiber-reinforced epoxy laminate material layer. The transponder chip module and the booster antenna may comprise components in a payment circuit, with the metal layer electrically isolated from the payment circuit. The booster antenna may be formed on or embedded in the fiber-reinforced epoxy laminate material layer. Processes for manufacturing transaction devices including a metal layer with one or more fiber-reinforced epoxy laminate material layers are also disclosed.

66 Claims, 12 Drawing Sheets

Related U.S. Application Data a continuation-in-part of application No. 16/783,504, filed on Feb. 6, 2020, now Pat. No. 10,926,439, which is a continuation of application No. 16/441,363, filed on Jun. 14, 2019, now Pat. No. 10,583,594, which is a continuation-in-part of application No. 16/427,864, filed on May 31, 2019, now Pat. No. 10,977,540, which is a continuation-in-part of application No. 16/320,597, which is a continuation of application No. 16/164,322, filed on Oct. 18, 2018, now Pat. No. 10,406,734, which is a continuation of application No. 15/928,813, filed on Mar. 22, 2018, now Pat. No. 10,762,412, said application No. 16/441,363 is a continuation-in-part of application No. PCT/US2017/043954, filed on Jul. 26, 2017, now Pat. No. 11,267,172.

(60) Provisional application No. 62/971,439, filed on Feb. 7, 2020, provisional application No. 62/623,936, filed on Jan. 30, 2018, provisional application No. 62/367,362, filed on Jul. 27, 2016.

(51) Int. Cl.

| | |
|---|---|
| *H01Q 13/10* | (2006.01) |
| *H05K 1/18* | (2006.01) |
| *H05K 3/28* | (2006.01) |
| *H05K 3/30* | (2006.01) |
| *B22D 19/00* | (2006.01) |
| *B29C 45/17* | (2006.01) |
| *B29L 17/00* | (2006.01) |

(52) U.S. Cl.
CPC ........ *B29C 45/14639* (2013.01); *B29C 45/17* (2013.01); *G06K 19/077* (2013.01); *G06K 19/07745* (2013.01); *G06K 19/07749* (2013.01); *G06K 19/07777* (2013.01); *H01Q 13/10* (2013.01); *H05K 1/18* (2013.01); *H05K 3/284* (2013.01); *H05K 3/285* (2013.01); *H05K 3/301* (2013.01); *B29L 2017/006* (2013.01); *H05K 2201/1003* (2013.01); *H05K 2203/1316* (2013.01); *H05K 2203/1327* (2013.01)

(58) Field of Classification Search
CPC ........... G06K 19/077; G06K 19/07745; G06K 19/07749; G06K 19/07777; H01Q 13/10; H05K 1/18; H05K 3/284; H05K 3/285; H05K 3/301
USPC .................................. 235/492, 487, 380, 375
See application file for complete search history.

(56) References Cited

U.S. PATENT DOCUMENTS

| | | | |
|---|---|---|---|
| 5,013,900 A | 5/1991 | Hoppe | |
| 5,350,553 A | 9/1994 | Gläser et al. | |
| 5,463,953 A | 11/1995 | Kaspers et al. | |
| 5,574,309 A | 11/1996 | Papapietro et al. | |
| 5,598,032 A | 1/1997 | Fidalgo | |
| 5,681,356 A | 10/1997 | Barak et al. | |
| 5,774,339 A | 6/1998 | Ohbuchi et al. | |
| 5,835,497 A | 11/1998 | Litzenberger et al. | |
| 5,962,840 A | 10/1999 | Haghiri-Tehrani et al. | |
| 6,065,681 A | 5/2000 | Trueggelmann | |
| 6,188,580 B1 | 2/2001 | Huber et al. | |
| 6,190,942 B1 | 2/2001 | Wilm et al. | |
| 6,724,103 B2 | 4/2004 | Parrault | |
| D529,955 S | 10/2006 | Allard et al. | |
| 7,237,724 B2 | 7/2007 | Singleton | |
| 7,701,350 B2 | 4/2010 | Sakama et al. | |
| 7,762,470 B2 | 7/2010 | Finn et al. | |
| 7,823,777 B2 | 11/2010 | Varga et al. | |
| 7,936,273 B2 | 5/2011 | Kobayashi et al. | |
| 7,954,228 B2 | 6/2011 | Kobayashi et al. | |
| 8,128,000 B2 | 3/2012 | Forster | |
| 8,141,786 B2 | 3/2012 | Bhandarkar et al. | |
| 8,174,454 B2 | 5/2012 | Mayer | |
| 8,226,013 B2 | 7/2012 | Phillips et al. | |
| 8,248,240 B2 | 8/2012 | Osaki et al. | |
| 8,261,997 B2 | 9/2012 | Gebhart | |
| 8,448,872 B2 | 5/2013 | Droz | |
| 8,519,905 B2 | 8/2013 | Tanaka et al. | |
| 8,608,082 B2 | 12/2013 | Le Garrec et al. | |
| 8,622,311 B2 | 1/2014 | Hamedani et al. | |
| 8,698,633 B2 | 4/2014 | Kobayashi et al. | |
| 8,725,589 B1 | 5/2014 | Skelding et al. | |
| 8,786,510 B2 | 7/2014 | Coleman et al. | |
| 8,789,762 B2 | 7/2014 | Finn et al. | |
| 8,978,987 B2 | 3/2015 | Scarlatella | |
| 9,000,619 B2 | 4/2015 | Kato et al. | |
| 9,058,547 B2 | 6/2015 | Oh et al. | |
| 9,099,789 B1 | 8/2015 | Modro | |
| 9,251,458 B2 | 2/2016 | Finn et al. | |
| 9,320,186 B2 | 4/2016 | Droz | |
| 9,390,364 B2 | 7/2016 | Finn et al. | |
| 9,390,366 B1 | 7/2016 | Herslow et al. | |
| 9,475,086 B2 | 10/2016 | Finn et al. | |
| 9,489,613 B2 | 11/2016 | Finn et al. | |
| 9,576,238 B2 | 2/2017 | Yosui | |
| 9,622,359 B2 | 4/2017 | Finn et al. | |
| 9,634,391 B2 | 4/2017 | Finn et al. | |
| 9,697,459 B2 | 7/2017 | Finn et al. | |
| 9,721,200 B2 | 8/2017 | Herslow et al. | |
| D797,188 S | 9/2017 | Hendrick | |
| 9,760,816 B1 | 9/2017 | Williams et al. | |
| 9,798,968 B2 | 10/2017 | Finn et al. | |
| 9,812,782 B2 | 11/2017 | Finn et al. | |
| 9,836,684 B2 | 12/2017 | Finn et al. | |
| 9,898,699 B2 | 2/2018 | Herslow et al. | |
| D812,137 S | 3/2018 | Daniel et al. | |
| 10,032,099 B2 | 7/2018 | Mosteller | |
| 10,089,570 B2 | 10/2018 | Herslow et al. | |
| 10,140,569 B2 | 11/2018 | Kang et al. | |
| 10,147,999 B2 | 12/2018 | Wang et al. | |
| 10,193,211 B2 | 1/2019 | Finn et al. | |
| 10,318,859 B2 | 6/2019 | Lowe et al. | |
| 10,339,434 B2 | 7/2019 | Cox | |
| 10,445,627 B1 | 10/2019 | Sexl et al. | |
| 10,583,683 B1 | 3/2020 | Ridenour et al. | |
| 10,762,412 B2 | 9/2020 | Lowe et al. | |
| 2002/0190132 A1 | 12/2002 | Kayanakis | |
| 2003/0038174 A1 | 2/2003 | Jones | |
| 2003/0102541 A1 | 6/2003 | Gore et al. | |
| 2005/0087609 A1 | 4/2005 | Martin | |
| 2006/0102729 A1 | 5/2006 | Gandel et al. | |
| 2006/0219776 A1 | 10/2006 | Finn | |
| 2006/0226240 A1 | 10/2006 | Singleton | |
| 2007/0034700 A1 | 2/2007 | Poidomani et al. | |
| 2007/0075132 A1 | 4/2007 | Kean | |
| 2007/0290048 A1 | 12/2007 | Singleton et al. | |
| 2008/0001759 A1 | 1/2008 | Kobayashi et al. | |
| 2011/0024036 A1 | 2/2011 | Benato | |
| 2011/0315779 A1 | 12/2011 | Bidin et al. | |
| 2012/0044693 A1 | 2/2012 | Hatase et al. | |
| 2012/0201994 A1 | 8/2012 | Michalk | |
| 2012/0206869 A1 | 8/2012 | Droz | |
| 2013/0062875 A1 | 3/2013 | Le Loarer et al. | |
| 2013/0102113 A1 | 4/2013 | Yang | |
| 2013/0228628 A1 | 9/2013 | Bona et al. | |
| 2013/0255078 A1 | 10/2013 | Cox | |
| 2013/0299593 A1 | 11/2013 | Glidden, III | |
| 2014/0158773 A1 | 6/2014 | Blum | |
| 2014/0279555 A1 | 9/2014 | Guillaud | |
| 2014/0283978 A1 | 9/2014 | Droz | |
| 2014/0353384 A1* | 12/2014 | Hoegerl | G06K 19/07749 |
| | | | 257/773 |
| 2014/0361086 A1 | 12/2014 | Finn et al. | |
| 2015/0021403 A1 | 1/2015 | Finn et al. | |

(56) References Cited

U.S. PATENT DOCUMENTS

| | | |
|---|---|---|
| 2015/0097040 A1 | 4/2015 | Rampetzreiter et al. |
| 2015/0129665 A1 | 5/2015 | Finn et al. |
| 2015/0136858 A1 | 5/2015 | Finn et al. |
| 2015/0180229 A1 | 6/2015 | Herslow |
| 2015/0235063 A1 | 8/2015 | Loussert |
| 2015/0235122 A1 | 8/2015 | Finn et al. |
| 2015/0269471 A1 | 9/2015 | Finn et al. |
| 2015/0269474 A1 | 9/2015 | Finn et al. |
| 2015/0269477 A1 | 9/2015 | Finn et al. |
| 2015/0278675 A1 | 10/2015 | Finn et al. |
| 2015/0339564 A1 | 11/2015 | Herslow et al. |
| 2016/0110639 A1 | 4/2016 | Finn et al. |
| 2016/0180212 A1 | 6/2016 | Herslow et al. |
| 2016/0203399 A1 | 7/2016 | Cox |
| 2016/0229081 A1 | 8/2016 | Williams et al. |
| 2016/0365644 A1 | 12/2016 | Finn et al. |
| 2017/0017871 A1 | 1/2017 | Finn et al. |
| 2017/0077589 A1 | 3/2017 | Finn et al. |
| 2017/0106572 A1 | 4/2017 | Cepress et al. |
| 2017/0243099 A1 | 8/2017 | Kluge |
| 2017/0243104 A1 | 8/2017 | Cox |
| 2017/0262749 A1 | 9/2017 | Cox |
| 2017/0308785 A1 | 10/2017 | Kim et al. |
| 2017/0316300 A1 | 11/2017 | Herslow et al. |
| 2017/0323193 A1 | 11/2017 | Kitney et al. |
| 2018/0068212 A1 | 3/2018 | Williams et al. |
| 2018/0157954 A1 | 6/2018 | Herslow et al. |
| 2018/0204105 A1 | 7/2018 | Herslow et al. |
| 2018/0307962 A1 | 10/2018 | Lowe et al. |
| 2018/0339503 A1 | 11/2018 | Finn et al. |
| 2018/0341846 A1 | 11/2018 | Finn et al. |
| 2018/0341847 A1 | 11/2018 | Finn et al. |
| 2018/0349751 A1 | 12/2018 | Herslow et al. |
| 2019/0050706 A1 | 2/2019 | Lowe |
| 2019/0114526 A1 | 4/2019 | Finn et al. |
| 2019/0130242 A1 | 5/2019 | Fu et al. |
| 2019/0156073 A1 | 5/2019 | Finn et al. |
| 2019/0156994 A1 | 5/2019 | Cox |
| 2019/0197381 A1 | 6/2019 | Cox |
| 2019/0204812 A1 | 7/2019 | Cox |
| 2019/0206161 A1 | 7/2019 | Cox |
| 2019/0236434 A1 | 8/2019 | Lowe |
| 2019/0240886 A1 | 8/2019 | van Peer et al. |
| 2019/0279065 A1 | 9/2019 | Cox |
| 2019/0300695 A1 | 10/2019 | Cox |
| 2020/0160135 A1 | 5/2020 | Lowe et al. |

FOREIGN PATENT DOCUMENTS

| | | |
|---|---|---|
| CN | 103153640 A | 6/2013 |
| DE | 19703122 C1 | 5/1998 |
| DE | 19848193 C1 | 11/1999 |
| DE | 19934434 A1 | 2/2001 |
| DE | 10132893 A1 | 1/2003 |
| DE | 102007016777 A1 | 10/2008 |
| DE | 102008053582 B3 | 4/2010 |
| EP | 0277854 A1 | 8/1988 |
| EP | 0426406 A2 | 5/1991 |
| EP | 2133828 A2 | 12/2009 |
| EP | 2722193 A1 | 4/2014 |
| EP | 2765648 A1 | 8/2014 |
| EP | 3009964 A1 | 4/2016 |
| JP | 61222715 A | 10/1986 |
| JP | 63072596 A | 4/1988 |
| JP | 63185688 A | 8/1988 |
| JP | 63239097 A | 10/1988 |
| JP | 021397 A | 1/1990 |
| JP | 02055198 A | 2/1990 |
| JP | 03205197 A | 9/1991 |
| JP | 0564861 A | 3/1993 |
| JP | 07501758 A | 2/1995 |
| JP | 08276459 A | 10/1996 |
| JP | 09315053 A | 12/1997 |
| JP | 10291392 A | 11/1998 |
| JP | 1111056 A | 1/1999 |
| JP | 2001505682 A | 4/2001 |
| JP | 2003234615 A | 8/2003 |
| JP | 2004094561 A | 3/2004 |
| JP | 2007021830 A | 2/2007 |
| JP | 2008538430 A | 10/2008 |
| JP | 2013162195 A | 8/2013 |
| KR | 20010080890 A | 8/2001 |
| KR | 20140117614 A | 10/2014 |
| KR | 20170061572 A | 6/2017 |
| KR | 20170120524 A | 10/2017 |
| TW | 201808635 A | 3/2018 |
| WO | 9809252 A1 | 3/1998 |
| WO | 2006107968 A1 | 10/2006 |
| WO | 2013110625 A1 | 8/2013 |
| WO | 2013115148 A1 | 8/2013 |
| WO | 2015071017 A1 | 5/2015 |
| WO | 2015071086 A1 | 5/2015 |
| WO | 2015144261 A1 | 10/2015 |
| WO | 2016020067 A1 | 2/2016 |
| WO | 2016046184 A1 | 3/2016 |
| WO | 2016073473 A1 | 5/2016 |
| WO | 2017007468 A1 | 1/2017 |
| WO | 2017090891 A1 | 6/2017 |
| WO | 2017177906 A1 | 10/2017 |
| WO | 2018022755 A1 | 2/2018 |
| WO | 2018132404 A1 | 7/2018 |
| WO | 2018138432 A1 | 8/2018 |
| WO | 2018202774 A | 11/2018 |

OTHER PUBLICATIONS

Taiwan Office Action for Taiwan Application No. 109117975, dated Sep. 24, 2021 with translation, 22 pages.
Japanese Notice of Reasons for Refusal for Japanese Application No. 2021-521110, dated Apr. 26, 2022 with translation, 11 pages.
Canadian Examination Report for Canadian Application No. 3,088,900, dated Apr. 8, 2021, 6 pages.
Non Final Office Action for U.S. Appl. No. 16/320,597, dated Apr. 13, 2021, 74 pages.
International Preliminary Report on Patentability for International Application No. PCT/US2019/056704, dated Apr. 14, 2021, 7 pages.
International Search Report and Written Opinion for International Application No. PCT/US2021/013796, dated May 11, 2021, 22 pages.
Notice of Termination of Pretrial Reexamination for Japanese Application No. 2019-504037, dated May 18, 2021 with translation, 2 pages.
Report of Pretrial Reexamination of Japanese Application No. 2019-504037, dated May 12, 2021 with translation, 5 pages.
Japanese Notice of Reasons for Rejection for Japanese Application No. 2020-522026, dated May 25, 2021 with translation, 8 pages.
Australian Examination Report for Australian Application No. 2019213838, dated Jun. 29, 2021, 8 pages.
Japanese Notice of Reasons for Rejection for Japanese Application No. 2020-541522, dated May 31, 2021 with translation, 7 pages.
Non Final Office Action for U.S. Appl. No. 17/128,427, dated Jun. 29, 2021, 53 pages.
Chen et al., "A Metallic RFID Tag Design for Steel-Bar and Wire-Rod Management Application in the Steel Industry", Progress in Electromagnetics Research, PIER 91, 2009, pp. 195-212.
European Communication Pursuant to Article 94(3) for European Application No. 17835207.6, dated Oct. 23, 2020, 6 pages.
Extended European Search Report for European Application No. 17835207.6, dated Mar. 10, 2020, 12 pages.
Final Office Action for U.S. Appl. No. 16/124,711, dated Aug. 7, 2020, 18 pages.
Final Office Action for U.S. Appl. No. 16/164,322, dated Apr. 11, 2019, 20 pages.
International Preliminary Report on Patentability for International Application No. PCT/US2017/043954, dated Jan. 29, 2019, 6 pages.
International Preliminary Report on Patentability for International Application No. PCT/US2018/052832, dated Apr. 21, 2020, 9 pages.

(56) References Cited

OTHER PUBLICATIONS

International Preliminary Report on Patentability for International Application No. PCT/US2018/049899, dated Mar. 10, 2020, 8 pages.
International Search Report and Written Opinion for International Application No. PCT/US2017/043954, dated Oct. 5, 2017, 6 pages.
International Search Report and Written Opinion for International Application No. PCT/US2019/014656, dated Apr. 1, 2019, 16 pages.
International Search Report and Written Opinion for International Application No. PCT/US2019/056704, dated Dec. 18, 2019, 11 pages.
International Search Report and Written Opinion for International Application No. PCT/US2020/034661, dated Sep. 1, 2020, 16 pages.
Japanese Decision of Final Rejection for Japanese Application No. 2019-504037, dated Oct. 6, 2020, with translation, 5 pages.
Japanese Notice of Reasons for Rejection for Japanese Application No. 2019-504037, dated Mar. 10, 2020 with translation, 7 pages.
Korean Office Action for Korean Application No. 10-2019-7005614, dated Apr. 17, 2020, with translation, 14 pages.
Non Final Office Action for U.S. Appl. No. 15/928,813, dated Apr. 15, 2020, 51 pages.
Non Final Office Action for U.S. Appl. No. 16/124,711, dated May 1, 2020, 31 pages.
Non Final Office Action for U.S. Appl. No. 16/427,864, dated Nov. 4, 2020, 56 pages.
Non Final Office Action for U.S. Appl. No. 16/441,363, dated Aug. 8, 2019, 23 pages.
Non Final Office Action for U.S. Appl. No. 16/751,285, dated Jan. 25, 2021, 51 pages.
Non Final Office Action for U.S. Appl. No. 29/663,230, dated Jul. 25, 2019, 19 pages.
Notice of Allowance for Application No. 16/783,504, dated Nov. 13, 2020, 12 pages.
Third Party Submission Under 37 CFR 1.290, filed in U.S. Appl. No. 15/928,813, Concise Description of Relevance, dated Oct. 15, 2019, 13 pages.
Third Party Submission Under 37 CFR 1.290, filed in U.S. Appl. No. 15/928,813, Concise Description of Relevance, dated Oct. 27, 2019, 13 pages.
Third Party Submission Under 37 CFR 1.290, filed in U.S. Appl. No. 15/928,813, Concise Description of Relevance, dated Nov. 11, 2019, 8 pages.
U.S. Appl. No. 62/730,282, filed Sep. 12, 2018, 14 pages.
Entire patent prosecution history of U.S. Appl. No. 16/320,597, filed Jan. 25, 2019, entitled, "Overmolded Electronic Components for Transaction Cards and Methods of Making Thereof."
Entire patent prosecution history of U.S. Appl. No. 15/742,813, filed, Jan. 8, 2018, entitled, "Metal Smart Card With Dual Interface Capability."
Entire patent prosecution history of U.S. Appl. No. 16/983,395, filed Aug. 3, 2020, entitled, "DI Capacitive Embedded Metal Card."
Entire patent prosecution history of U.S. Appl. No. 16/164,322, filed Oct. 18, 2018, entitled, "Overmolded Electronic Components for Transaction Cards and Methods of Making Thereof."
Entire patent prosecution history of U.S. Appl. No. 16/441,363, filed Jun. 14, 2019, entitled, "Overmolded Electronic Components for Transaction Cards and Methods of Making Thereof."
Entire patent prosecution history of U.S. Appl. No. 16/783,504, filed Feb. 6, 2020, entitled, "Overmolded Electronic Components for Transaction Cards and Methods of Making Thereof."
Entire patent prosecution history of U.S. Appl. No. 16/427,864, filed May 31, 2019, entitled, "RFID Device."
Non Final Office Action for U.S. Appl. No. 17/128,427, dated Dec. 15, 2021, 20 pages.
Chinese Office Action for Chinese Application No. 201780046491.5, dated Jul. 5, 2021 with translation, 16 pages.
Indian Examination Report for Indian Application No. 202017013311, dated Jul. 8, 2021 with translation, 6 pages.
Indian Examination Report for Indian Application No. 202017030442, dated Jun. 2, 2022 with translation, 7 pages.
Taiwan Office Action for Applicatioin No. 110103206, dated Jan. 27, 2022 with translation, 40 pages.
Japanese Notice of Reasons for Rejection for Japanese Application No. 2021-003355, dated Oct. 11, 2022 with translation, 7 pages.

* cited by examiner

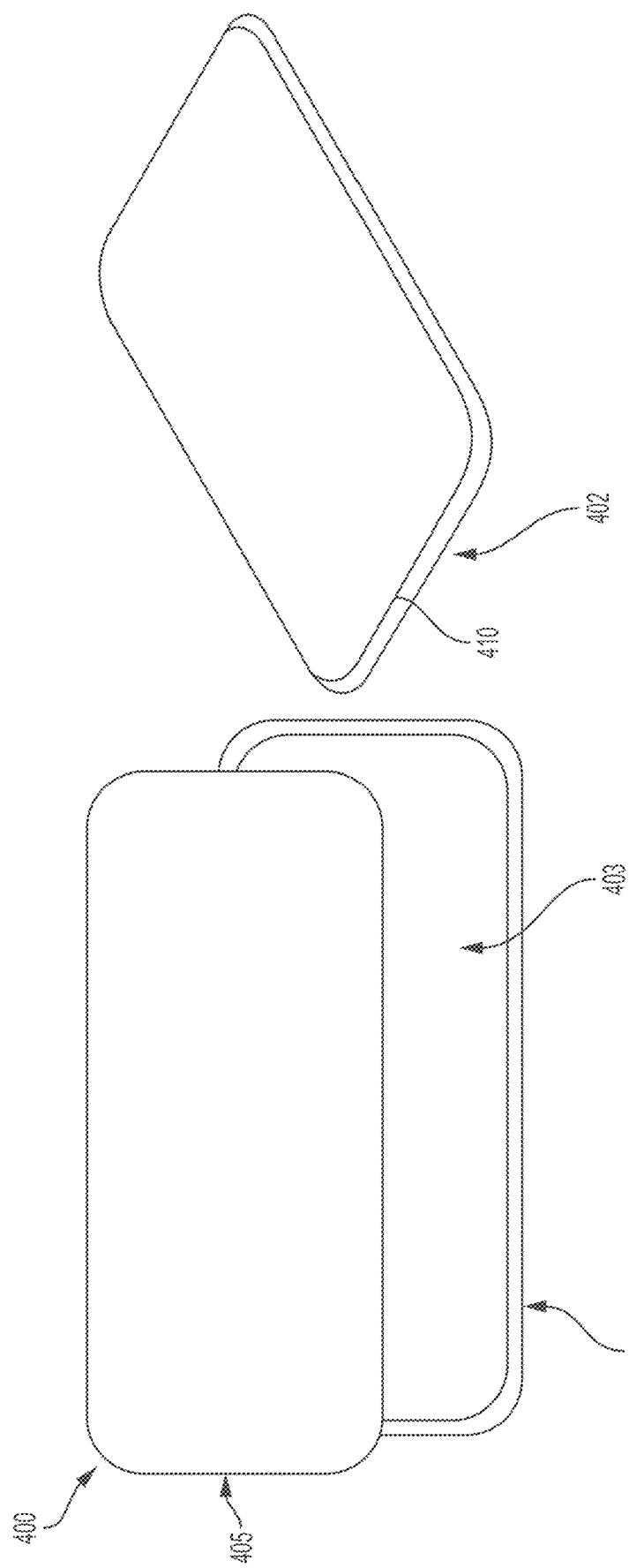

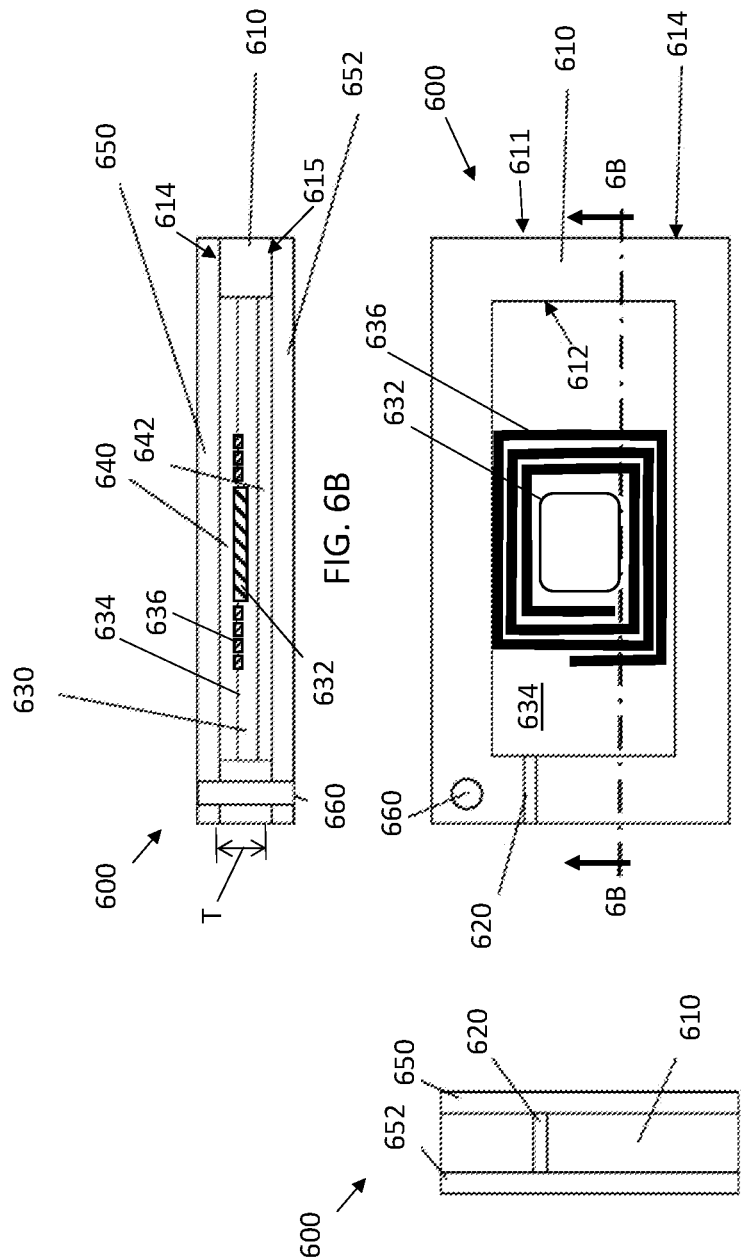

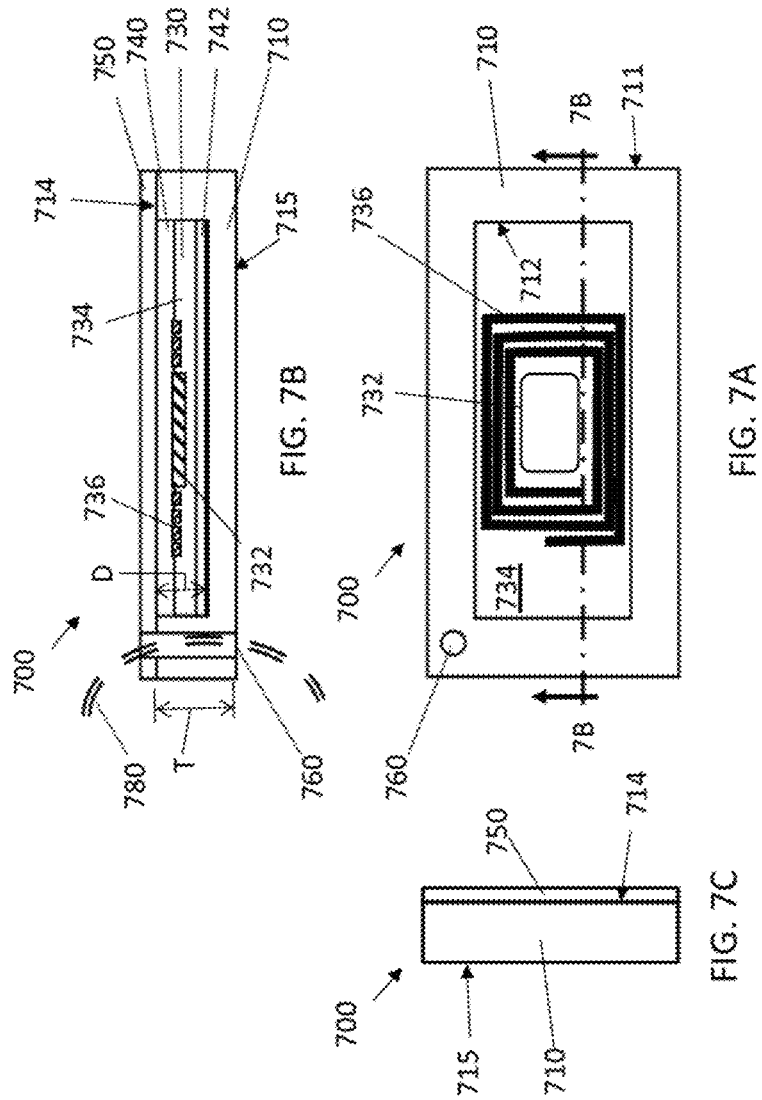

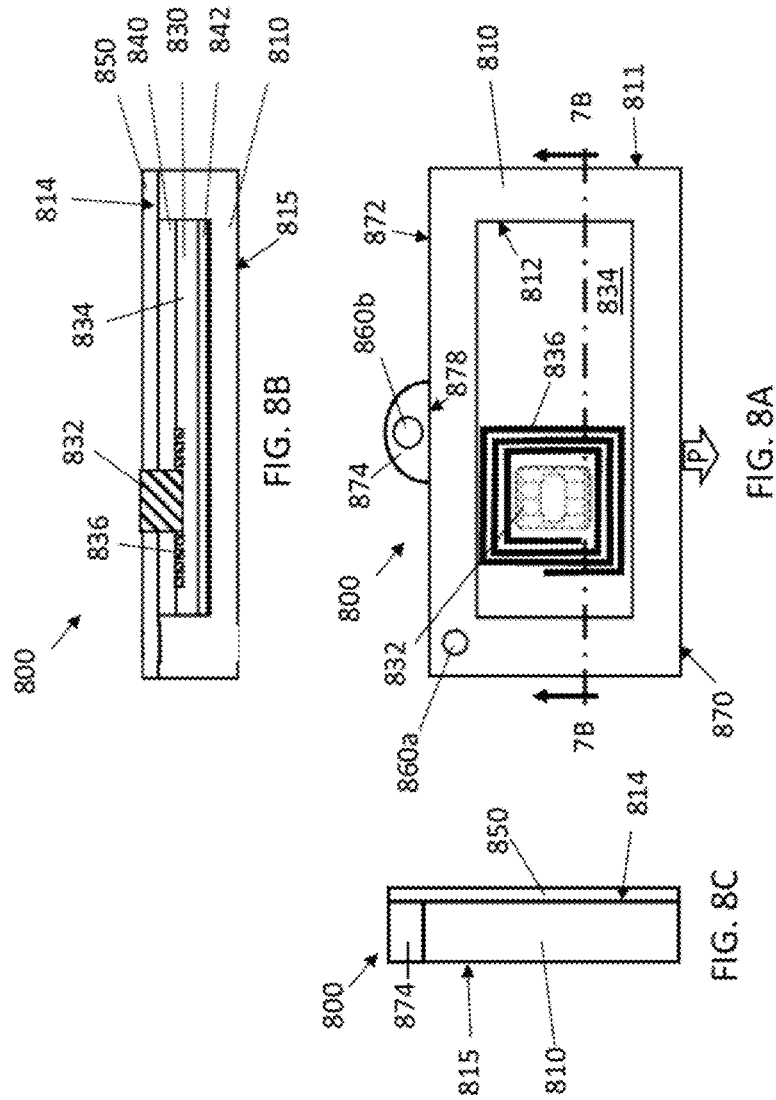

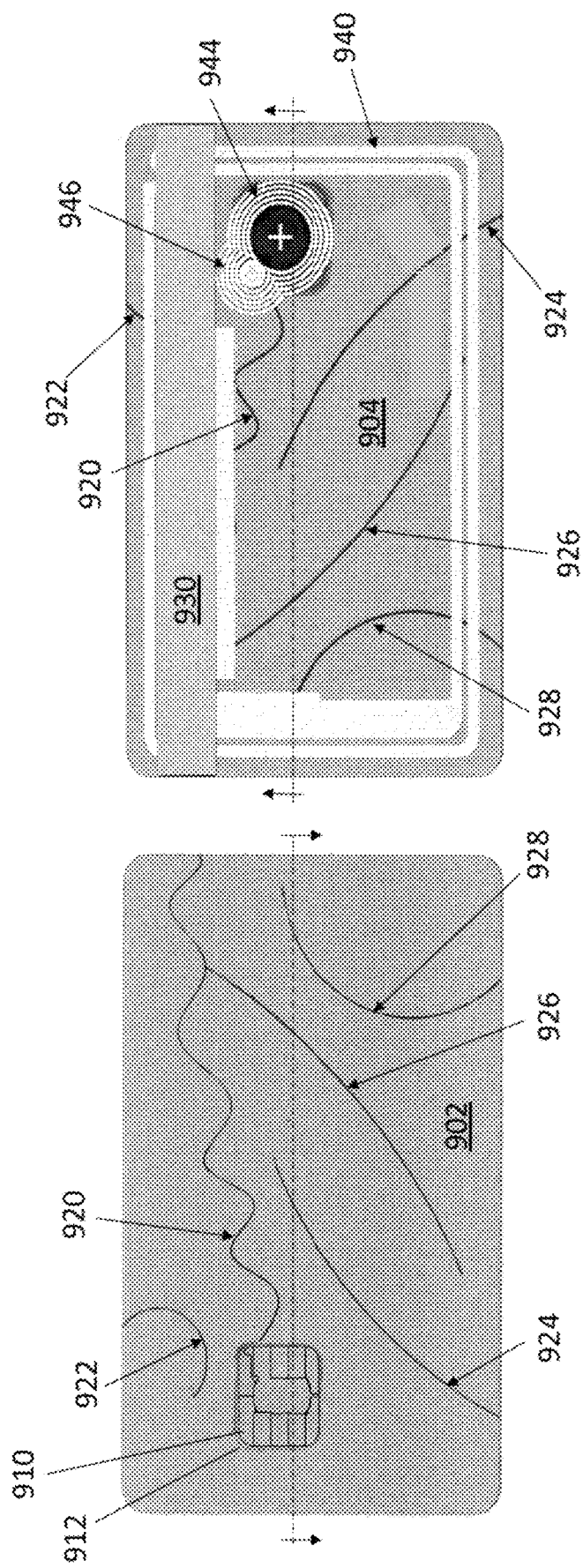

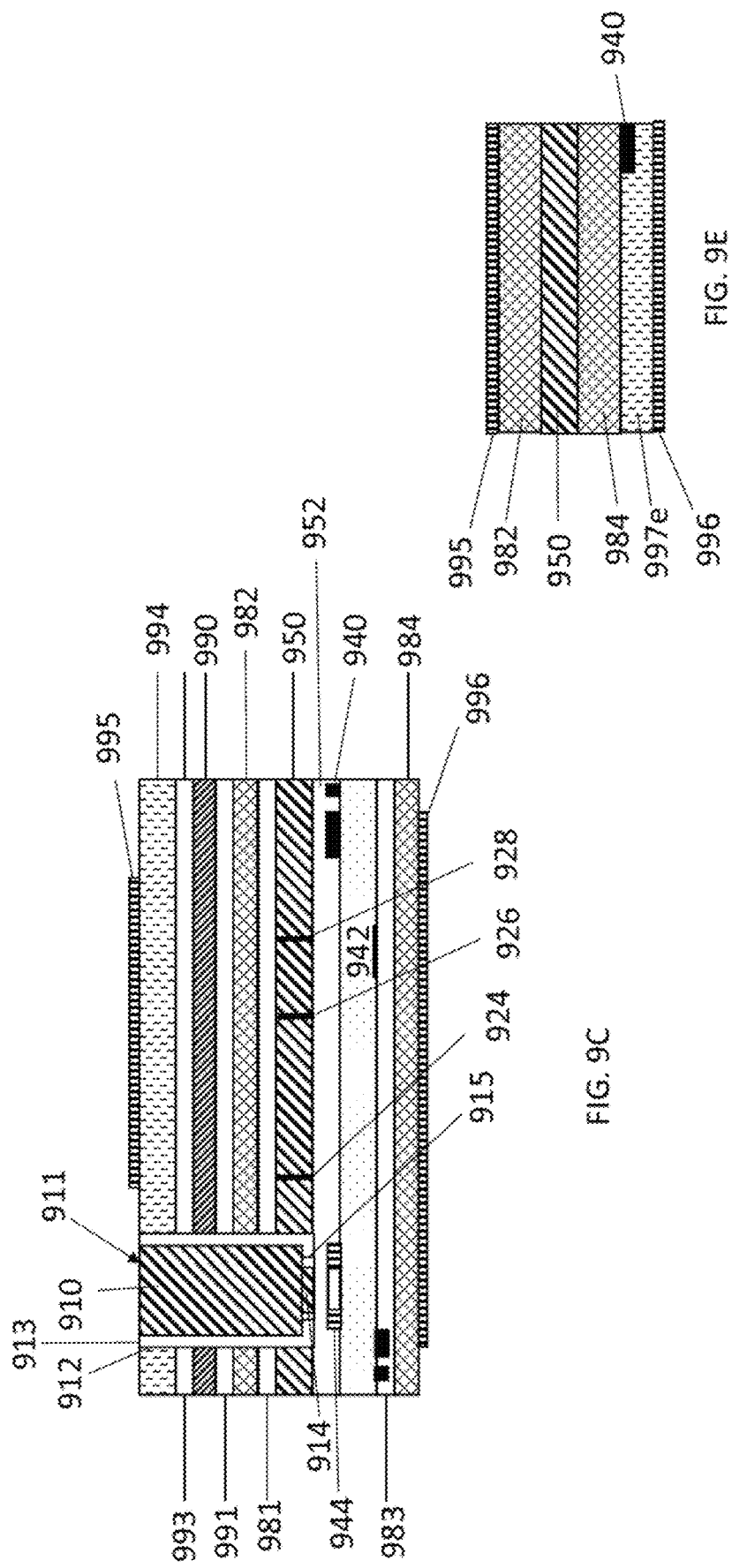

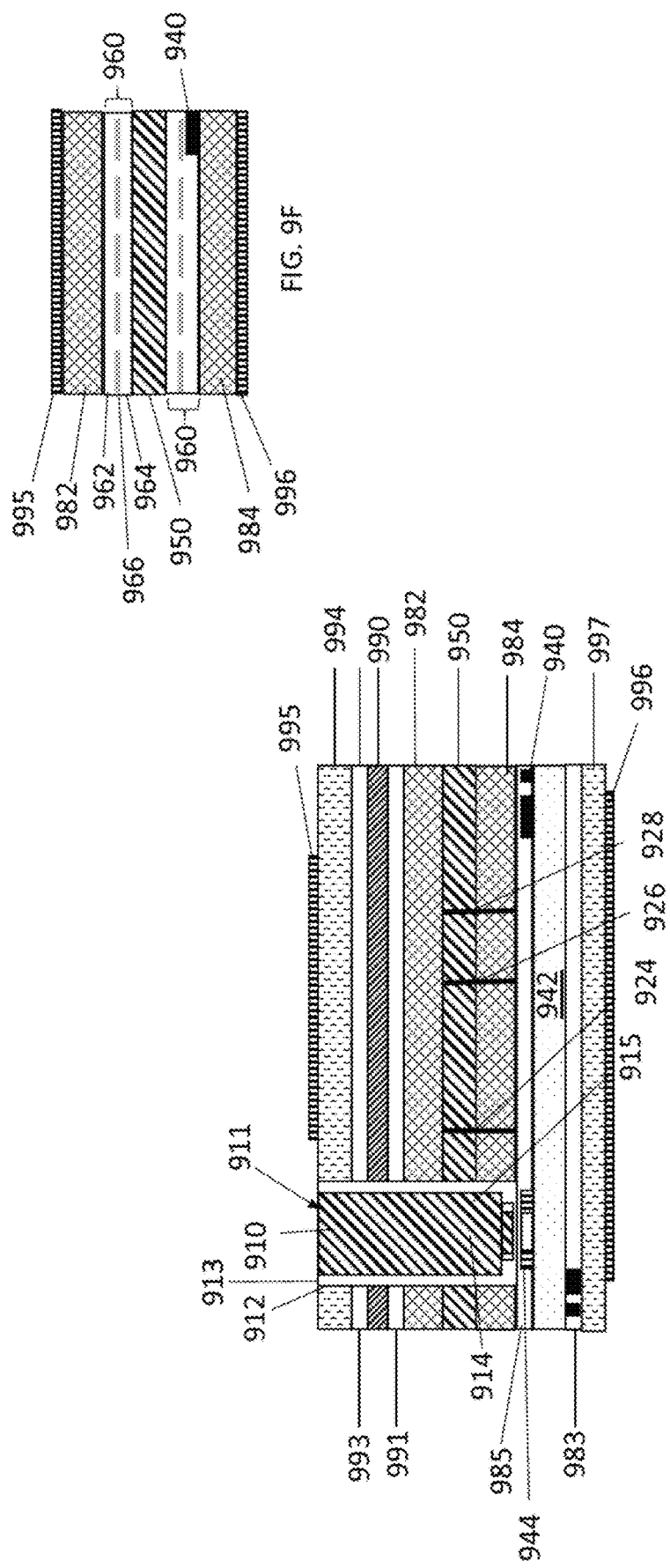

DI METAL TRANSACTION DEVICES AND PROCESSES FOR THE MANUFACTURE THEREOF

CROSS-REFERENCE TO RELATED APPLICATIONS

This application claims priority from U.S. Provisional Application Ser. No. 62/971,439, filed Feb. 7, 2020, titled DI METAL TRANSACTION DEVICES AND PROCESSES FOR THE MANUFACTURE THEREOF, incorporated herein by reference. This application is also a continuation-in-part of U.S. application Ser. No. 16/783,504, filed Feb. 6, 2020 (status: allowed), titled OVERMOLDED ELECTRONIC COMPONENTS FOR TRANSACTION CARDS AND METHODS OF MAKING THEREOF, which is a continuation of U.S. application Ser. No. 16/441,363, filed Jun. 14, 2019 (status: granted as U.S. Pat. No. 10,583,594 on Mar. 10, 2020), which is a continuation of U.S. application Ser. No. 16/164,322, filed 18 Oct. 2018, (status: granted as U.S. Pat. No. 10,406,734 on Sep. 10, 2019), which is a continuation-in-part of PCT Application No. PCT/US2017/043954, filed 26 Jul. 2017, which claims priority to U.S. Provisional Application No. 62/367,362, filed 27 Jul. 2016. This application is also a continuation-in-part of U.S. patent application Ser. No. 16/427,864, filed May 31, 2019 (status: allowed), titled RFID DEVICE, which is a continuation-in-part of U.S. patent application Ser. No. 16/164,322 (identified above), and is a continuation in part of U.S. patent application Ser. No. 16/320,597, filed 25 Jan. 2019, which is a national phase application of PCT Application Ser. No. PCT/US2017/43954 (identified above). The application is further a continuation-in-part of U.S. patent application Ser. No. 16/983,395, filed Aug. 3, 2020 (status: pending), titled DI CAPACITIVE EMBEDDED METAL CARD, which is a continuation of U.S. patent application Ser. No. 15/928,813 filed on Mar. 22, 2018, (status: granted as U.S. Pat. No. 10,762,412 on Sep. 1, 2020), which claims priority to U.S. Application No. 62/623,936, filed Jan. 30, 2018. The contents of all of the foregoing applications are incorporated herein by reference in their entirety for all purposes.

FIELD OF THE INVENTION

This invention relates to transaction cards with electronic components and methods for producing the same.

BACKGROUND OF THE INVENTION

Metal payment cards present unique challenges when including electronic components, such as inductive coupling payment modules, RF electronics, and standalone electronic inlays. To accommodate these components, the metal is machined into various geometries, then the component is placed in the cavity and left exposed or hidden under a printed sheet of plastic or other decorative element. The decorative element may be affixed to the card through a variety of processes such as platen lamination, contact adhesive, curable adhesives, or "push fit" or any joining method known to the art. RF shielding is often required in the cavity, further complicating card assembly while maintaining the desired aesthetic of the card.

Some of these required machining geometries remove significant amounts of metal or leave slits or holes through the card which weaken its strength and are undesirable aesthetically. In order to strengthen the card and provide a desirable surface, overmolding and insert molding techniques have been developed to encapsulate electronic inlays within the cards and strengthen the card geometries. Furthermore, this development has improved RF performance over existing designs because it enables more metal removal in critical RF transmission and receiving areas while maintaining structural rigidity and desired appearance.

SUMMARY OF THE INVENTION

Aspects of the invention relate to transaction devices, processes for manufacturing transaction devices, as well as transaction devices produced according to the disclosed processes.

One aspect of the invention is a transaction device comprising a metal layer having a front surface, a back surface, a periphery, an opening in the metal layer, a transponder chip module disposed in the opening, and a booster antenna in communication with the transponder chip module. The transponder chip module and the booster antenna are components in a circuit configured for wireless communication with a device reader. The metal layer has one or more discontinuities, each discontinuity comprising a gap in the metal layer extending from the front surface to the back surface, including at least one discontinuity that defines a path from the device periphery to the opening. The metal layer is not part of the booster antenna or a component in the circuit.

A non-metal molding material may be disposed in the one or more discontinuities in the metal layer. In some embodiments, a reinforcing layer is disposed over the metal layer, such as a layer comprising fiberglass, more particularly a fiber-reinforced epoxy laminate material. A fiber-reinforced epoxy laminate material layer may be disposed on at least one of the front surface and the back surface of the metal layer, and in some embodiment, the metal layer is sandwiched between opposite fiber-reinforced epoxy laminate material layers.

Another aspect of the invention comprises a transaction device having a metal layer with one or more discontinuities in the metal layer, a first non-metal, reinforcing layer disposed over the front surface of the metal layer, a booster antenna disposed over the back surface of the metal layer, a second non-metal, reinforcing layer disposed over the back surface of the metal layer, an opening in the metal layer extending through the first non-metal, reinforcing layer, and a transponder chip module disposed in the opening. The booster antenna comprises a plurality of metallizations electrically isolated from the metal layer. The transponder chip module is in communication with the booster antenna and together with the booster antenna comprises a payment circuit configured for wireless communication with a device reader. The first non-metal layer and the second non-metal layer each may comprise fiber-reinforced epoxy laminate material.

The one or more discontinuities may include a discontinuity extending from the periphery to the opening in the metal layer, a discontinuity extending from the periphery to an endpoint not in the opening in the metal layer, a discontinuity extending from an intersection with the first discontinuity to and endpoint that is neither in the opening nor at the periphery, or a combination thereof. The metal layer may be electrically isolated from the payment circuit or part of the payment circuit.

Another aspect of the invention comprises a transaction device comprising a metal layer, an opening in the metal layer extending from the metal layer to a top surface of the device, one or more discontinuities in the metal layer, a back fiber-reinforced epoxy laminate material layer disposed over the back surface of the metal layer, a booster antenna, and a transponder chip module disposed in the opening and having a top surface accessible from the top surface of the device. At least one discontinuity extends between the periphery of the metal layer and the opening in the metal layer. The transponder chip module in communication with the booster antenna together comprise a payment circuit configured for wireless communication with a device reader. The booster antenna may comprise the metal layer, or it may be separate from the metal layer, with the metal layer electrically isolated from the payment circuit. A front fiber-reinforced epoxy laminate material layer may be disposed over the front side of the metal layer. The front and/or back fiber-reinforced epoxy laminate material layers may each be bonded directly to the metal layer by the epoxy of the respective fiber-reinforced epoxy laminate material layers. In embodiments in which the metal layer is electrically isolated from the payment circuit and the booster antenna, the booster antenna may comprise a plurality of metallizations on or embedded in the back fiber-reinforced epoxy laminate material layer. In embodiments in which the plurality of metallizations are disposed on a back surface of the back fiber-reinforced epoxy laminate material layer, the device may include a non-metal layer disposed over the plurality of metallizations. The respective fiber-reinforced epoxy laminate material layers may be disposed over the front side and back side of the metal layer as discrete layers bonded to the metal layer by an adhesive other than the epoxy of the respective fiber-reinforced epoxy laminate material layers. In some embodiments, at least a portion of the plurality of booster antenna metallizations may be disposed on a front surface of the back fiber-reinforced epoxy laminate material layer and separated from the metal layer by a non-metal layer disposed between the fiber-reinforced epoxy laminate material layer and the metal layer.

Other aspects of the invention comprise processes for manufacturing transaction devices as described herein. One such process comprises providing a metal layer, forming one or more discontinuities in the metal layer, disposing a booster antenna over the back surface of the metal layer, disposing a first fiberglass layer over the front surface of the metal layer, disposing a second fiberglass layer over the back surface of the metal layer, forming an opening in the metal layer extending through the first fiberglass layer to a top surface of the device, and disposing a transponder chip module in the opening. The opening in the metal layer may be created in the same step as the discontinuities in the metal layer.

The process may include disposing the booster antenna layer over the back surface of the metal layer with metallizations of the booster antenna electrically isolated from the metal layer, and configuring the device with the metal layer not included in the payment circuit. The step of disposing the booster antenna over the back surface of the metal layer may comprise forming the plurality of metallizations on or embedded in the second fiberglass layer, and optionally, disposing an additional non-metal layer over the metallizations.

In one process embodiment, the steps of disposing the first and second fiberglass layers over the front and back surfaces of the metal layer comprise casting the first and second fiberglass layers with epoxy to form first and second fiber-reinforced epoxy laminate material layers bonded directly to the metal layer.

In another process embodiment, the steps of disposing the first and second fiberglass layers over the front and back surfaces of the metal layer comprise attaching a first cured fiber-reinforced epoxy laminate material layer to the front surface of the metal layer with a first adhesive layer and attaching a second cured fiber-reinforced epoxy laminate material layer to the back surface of the metal layer with a second adhesive layer. In embodiment that include forming the booster antenna over the back surface of the metal layer, the plurality of metallizations may be formed on or embedded in the second cured fiber-reinforced epoxy laminate material layer. One such process includes disposing a metal layer over the second cured fiber-reinforced epoxy laminate material layer, and etching away a portion of the metal layer to leave the metallizations. In a process including forming a plurality of metallizations on an inside surface of the second cured fiber-reinforced epoxy laminate material layer facing the metal layer, the second adhesive layer may includes a non-metal substrate layer, in a process including forming the plurality of metallizations on an outside surface of the second cured fiber-reinforced epoxy laminate material layer facing away from the metal layer, the process may include disposing a non-metal layer over the outside surface of the second cured fiber-reinforced epoxy laminate material and the plurality of metallizations disposed thereon.

In another aspect of the invention, a process for manufacturing a transaction device comprises providing a premade laminate comprised of a metal layer, a first cured fiber-reinforced epoxy laminate layer bonded to the front surface of the metal layer, and a second cured fiber-reinforced epoxy laminate layer bonded to the back surface of the metal layer. One or more discontinuities are formed in the metal layer of the premade laminate, each discontinuity comprising a gap in the metal layer extending from the front surface to the back surface, including at least one discontinuity extending to the periphery of the metal layer. Each of the one or more discontinuities also extending through at least one of the first cured fiber-reinforced epoxy laminate layer or the second cured fiber-reinforced epoxy laminate layer. A booster antenna is disposed over an outer surface of one of the first cured fiber-reinforced epoxy laminate layer or the second cured fiber-reinforced epoxy laminate layer. An opening in the metal layer is formed extending through the first fiberglass layer to a top surface of the device, and a transponder chip module is disposed in the opening. The booster antenna may be created by forming a plurality of metallizations on the outer surface of or embedded within one of the first cured fiber-reinforced epoxy laminate layer or the second cured fiber-reinforced epoxy laminate layer. The process may further include disposing a non-metal layer over the outside surface of the respective cured fiber-reinforced epoxy laminate material and the plurality of metallizations disposed thereon. It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawings, with like elements having the same reference numerals. When a plurality of similar elements is present, a single reference numeral may be assigned to the plurality of similar elements with a small letter designation referring to specific elements. When referring to the elements collectively or to a non-specific one or more of the elements, the small letter designation may be dropped. This emphasizes that according to common practice, the various features of the drawings are not drawn to scale unless otherwise indicated. On the contrary, the dimensions of the various features may be expanded or reduced for clarity. Included in the drawings are the following figures:

FIGS. 4A and 4B are schematic illustrations of selected steps of an over molding process for manufacturing a transaction card in accordance with aspects of the present invention.

FIG. 6A is a schematic illustration plan view of an exemplary contactless RFID device in accordance with one aspect of the invention, prior to encapsulating a chip layer within the opening in the frame.

FIG. 6B is a schematic illustration view of an exemplary contactless RFID device of FIG. 6A in cross-section through line 6B-6B, after encapsulating the chip layer.

FIG. 6C is a schematic illustration end view of the exemplary contactless RFID device of FIG. 6B.

FIG. 7A is a schematic illustration plan view of an exemplary contactless RFID device in accordance with another aspect of the invention, prior to encapsulating a chip layer within the opening in the frame.

FIG. 7B is a schematic illustration view of the exemplary contactless RFID device of FIG. 7A in cross-section through line 7B-7B, after encapsulating the chip layer.

FIG. 7C is a schematic illustration end view of the exemplary contactless RFID device of FIG. 7B.

FIG. 8A is a schematic illustration plan view of an exemplary DI RFID device in accordance with another aspect of the invention, prior to encapsulating a chip layer within the opening in the frame.

FIG. 8B is a schematic illustration view of the exemplary DI RFID device of FIG. 8A in cross-section through line 8B-8B, after encapsulating the chip layer.

FIG. 8C is a schematic illustration end view of the exemplary DI RFID device of FIG. 8B.

FIG. 9A is a schematic plan view illustration of a front side of an exemplary transaction card comprising a plurality of discontinuities.

FIG. 9B is a schematic plan view illustration of a back side of the exemplary transaction card of FIG. 9A.

FIG. 9C is a schematic cross-sectional view illustration of the exemplary transaction card of FIG. 9A.

FIG. 9D is a schematic cross-sectional view illustration of another exemplary transaction card, formed from a premade FR-4/metal laminate.

FIG. 9E is a is a schematic cross sectional view illustration of a portion of a transaction card comprising discrete FR-4 layers adhesively attached to the metal layer, with a metallization disposed on an inside surface of one of the FR-4 layers.

FIG. 9F is a schematic cross-sectional view illustration of a portion of a transaction card comprising FR-4 layers directly bonded to the metal layer, with a metallization etched onto an outside surface of one of the FR-4 layers, and an additional layer covering the metallization.

DETAILED DESCRIPTION OF THE INVENTION

Aspects of the invention relate to transaction cards, processes for manufacturing transaction cards, as well as transaction cards produced according to the disclosed methods.

Figure 1:
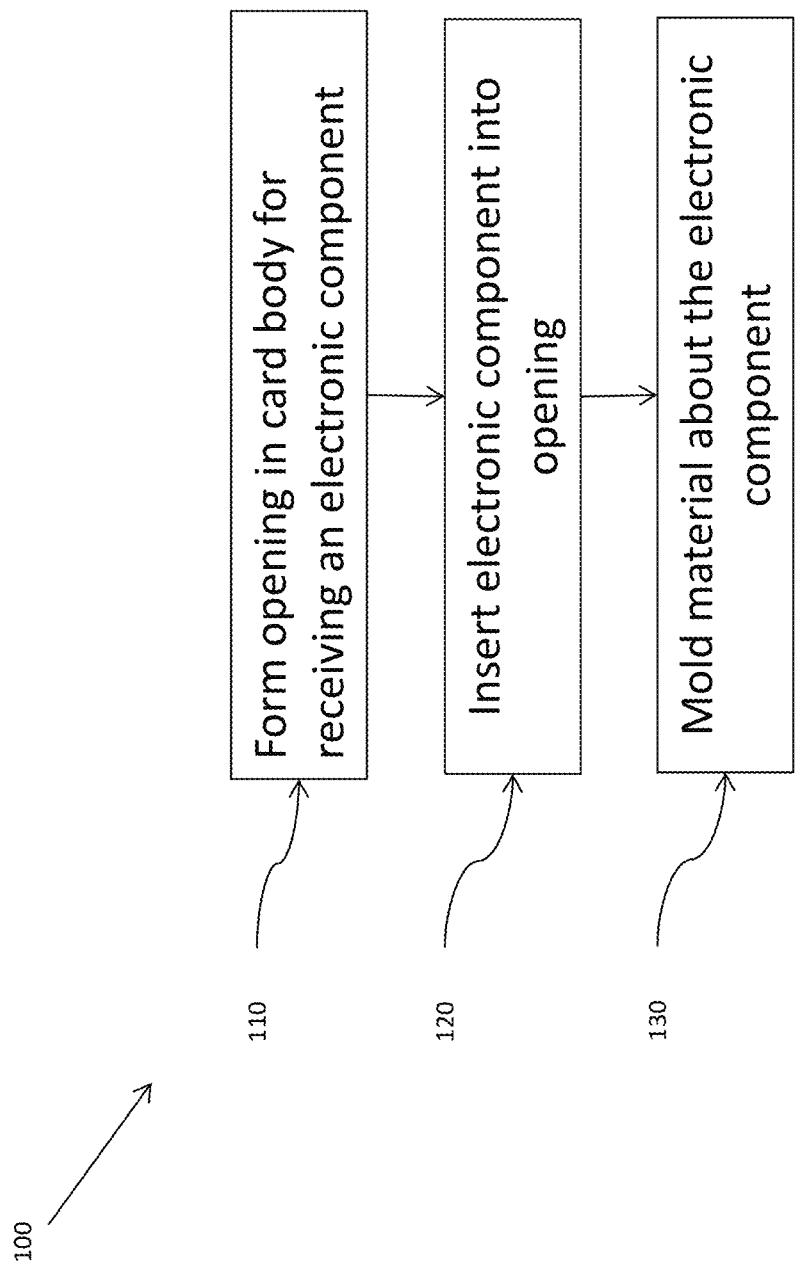
FIG. 1 is a flow diagram of selected steps of a process for manufacturing a transaction card in accordance with aspects of the present invention.

In FIG. 1, a flow diagram depicting selected steps of a process 100 for producing a transaction card according to aspects of the invention is shown. It should be noted that, with respect to the processes described herein, it will be understood from the description herein that one or more steps may be omitted and/or performed out of the described sequence of the process while still achieving the desired result.

In step 110, an opening is formed in the card body of the transaction card. The opening may be sized to accommodate one or more molded electronic components. The opening may extend partially (thereby forming, e.g., a pocket) or completely (thereby forming a hole) through the card body. In some embodiments, a hole formed through the card body may then be fully or partially covered on one side, such as with an applied material, such as an adhesively bonded plastic material, such as element 307c, shown in FIG. 3D. As depicted in FIG. 3D, element 307c overlaps an area surrounding the hole, to form a pocket bounded on the periphery by the edges of the hole in the card body and on a bottom end by the applied material 307c. The applied material may be a material that is the same or that is compatible with the molded material later to be filled in the pocket. In some embodiments, as shown in FIG. 3D, the applied material 307c overlapping the area surrounding the hole in the card body, may have a through-hole 308 having an area smaller than the hole in the card body, so as to provide a "ledge" 309 of applied material inside the periphery of the hole in the card body.

The card body of the present invention may be comprised of any suitable material including any suitable metal, such as stainless steel, bronze, copper, titanium, tungsten carbide, nickel, palladium, silver, gold, platinum, aluminum, or any alloy which gives the card most of its body (structure) and weight. Additionally, or alternatively, the card body described herein may be comprised of any suitable polymeric (e.g., polycarbonate, polyester) or inorganic (e.g., glass, ceramic) material, or any combination of any of the foregoing materials.

In step 120, an electronic component is inserted into the opening of the card body.

In step 130, a molding material is molded about the electronic component. It should be noted that the order of steps 120 and 130 may be varied depending on the particular application.

In one embodiment, step 130 includes an overmolding process. During the overmolding process, a molding material is molded about (and typically over) an electronic component such that the molding material covers at least a portion of a surface of the electronic component. Overmolding of electronic components may be accomplished using conventional and commercially available equipment, such as the ENGLE insert (Engel Austria GmbH, Austria) and the Cavist MoldMan™ (Reno, Nev.).

Figure 2B:
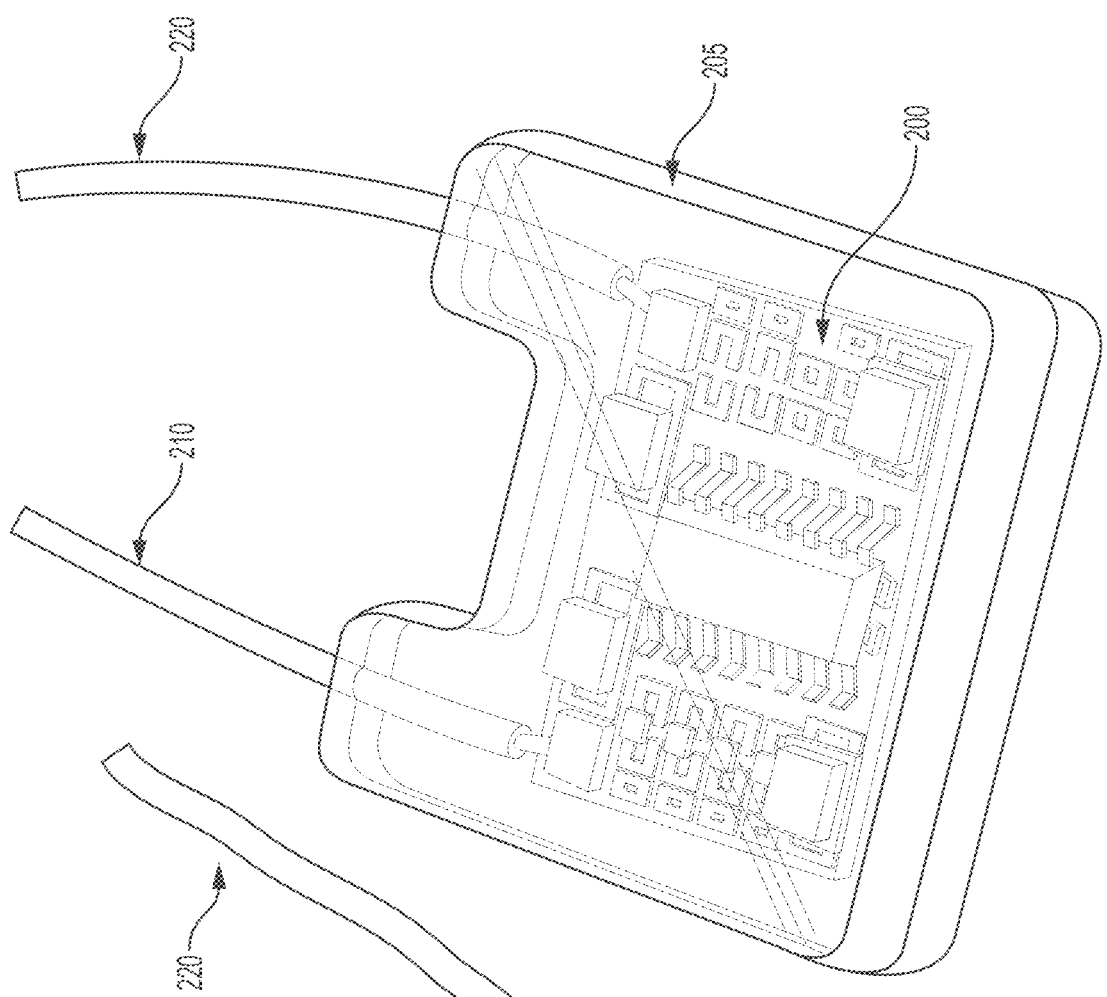
FIG. 2B is a photograph depicting an electronic component after overmolding in accordance with aspects of the present invention.
Figure 2A:
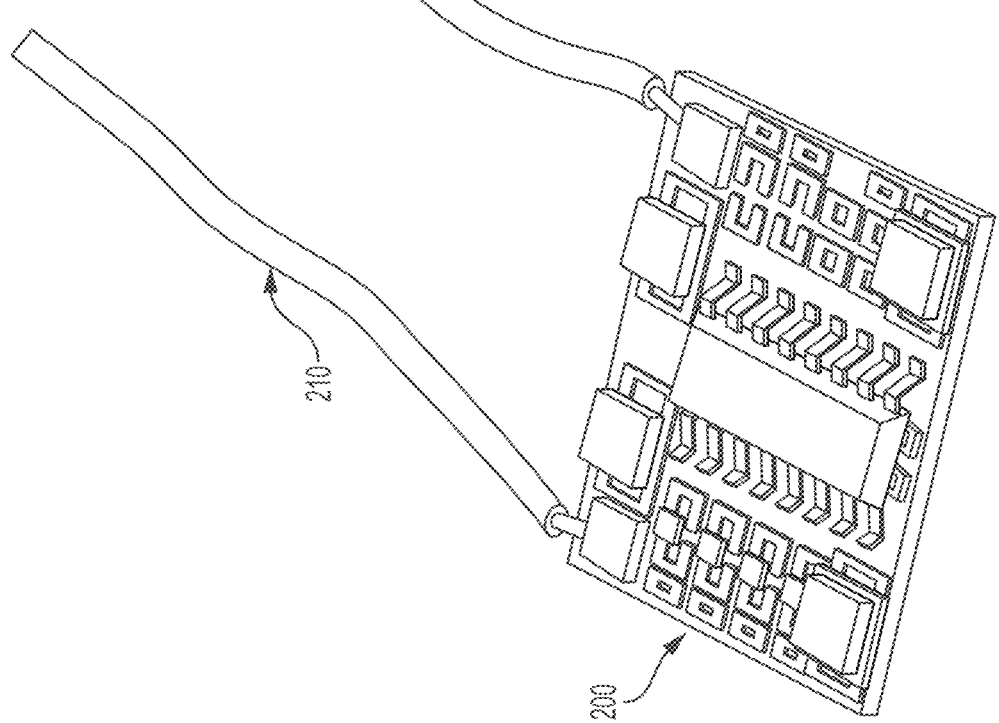
FIG. 2A is a photograph depicting an electronic component before overmolding in accordance with aspects of the present invention.

An electronic component 201 is shown before (in FIG. 2A) and after (in FIG. 2B) an overmolding process. While the overmolded component 200 is depicted as having molding material 205 completely covering electronic component 201, one of ordinary skill in the art will understand that varying degrees of overmolding can achieve the desired structural rigidity, functionality, and aesthetic of the transaction card. In particular, as shown in FIGS. 2A and 2B, electrical contacts, in the form of wires 210 and 220 connected to component 200, each have an unencapsulated end that protrudes from the overmolding to permit electrical connection to the component. It should be understood, that, although depicted as wires in FIGS. 2A and 2B, the electrical contacts or other unencapsulated portions not limited to electrical contacts, may take any shape or form. It should be further understood that in certain embodiments, such as embodiments in which a technically desirable degree of coupling between unencapsulated and encapsulated components can be made through the encapsulation layer, the component may be completely encapsulated.

Returning to FIG. 1, where an overmolding process is employed, step 130 may be performed prior to performing step 120. That is, the electronic component may be separately overmolded prior to insertion into the opening of the card body. Prior to the insertion of the overmolded electronic component, the overmolded component may be further machined to remove excess molding material and/or to create features in the molding material which may be used to secure the overmolded electronic component into the opening of the card body. For example, with reference to FIG. 2B, a lip may be machined into molding material 205 so that overmolded component 200 may be secured into the opening of a card body.

Alternatively, overmolding in step 130 may be performed after performing step 120. In this embodiment, the electronic component is inserted into the opening of the card body. Subsequently, molding material is forced to flow into the opening of the card body and form over one or more exposed surfaces, including at least the top surface, of the electronic component. One of ordinary skill in the art will understand that when molding material flows into the opening of the card body, the card body material may be selected so as to withstand the pressure and heat associated with overmolding without substantially deforming.

Where an insert molding process is employed, step 130 may be performed before performing step 120. Conventional insert molding processes include inserting the electronic component into a mold, followed by the injection of molding material into the mold cavity to form the molded electronic component. The molded electronic component may be fully or partially encapsulated by molding material following an insert molding process.

Figure 3A:
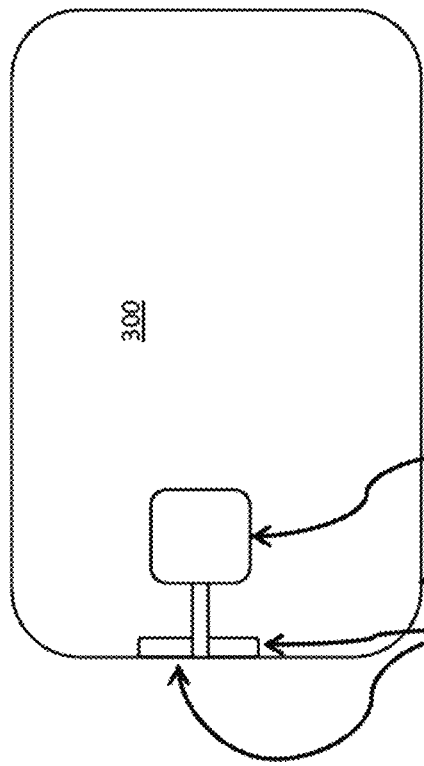
FIG. 3A is a schematic illustration of the front of a transaction card prior to insertion molding in accordance with aspects of the present invention.
Figure 3B:
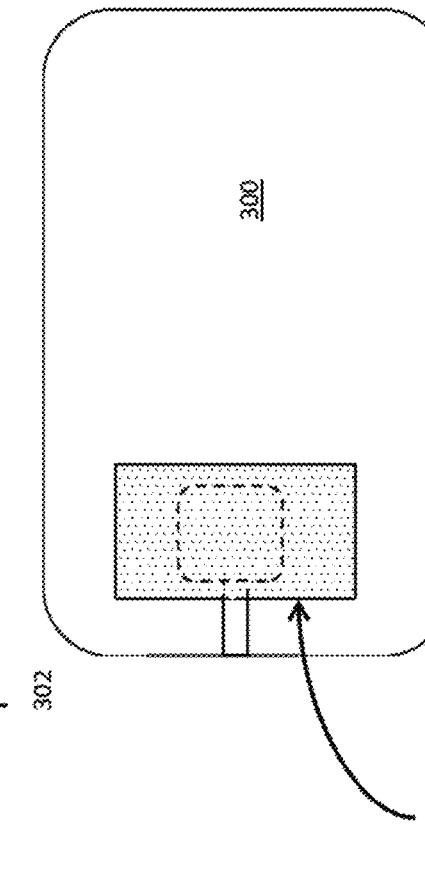
FIG. 3B is a schematic illustration of the rear of a transaction card prior to insertion molding in accordance with aspects of the present invention.
Figure 3C:
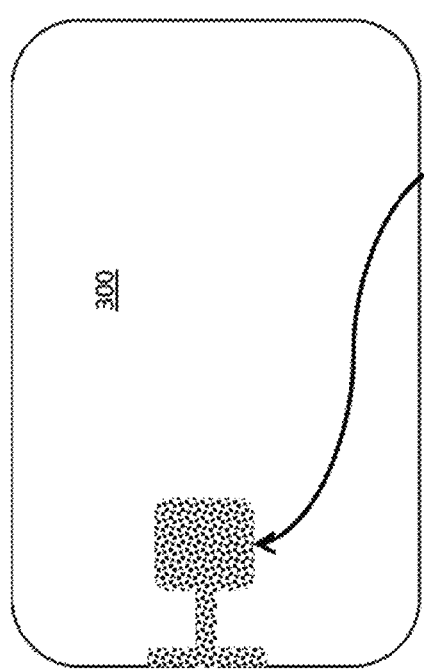
FIG. 3C is a schematic illustration of the front of a transaction card after to insertion molding in accordance with aspects of the present invention.
Figure 3D:
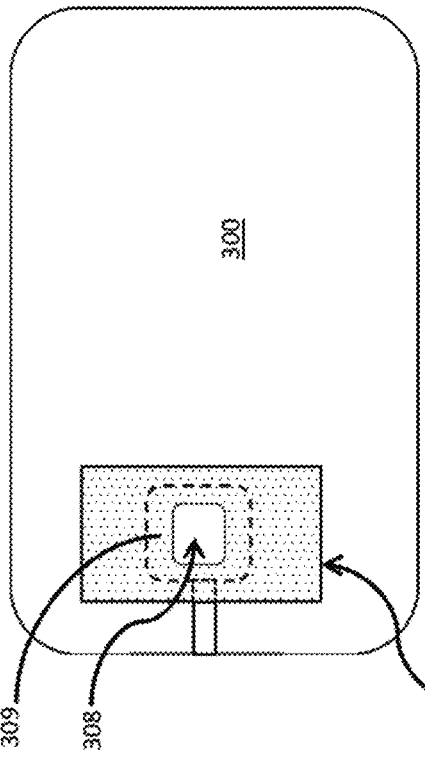
FIG. 3D is a schematic illustration of the rear of a transaction card after to insertion molding in accordance with aspects of the present invention.

Turning to FIGS. 3A-D, schematic illustrations of selected steps of an insert molding process for manufacturing a transaction card in accordance with aspects of the present invention are depicted. In the figures, areas 305 and 308 in FIGS. 3A-3D represent holes through the cards. Area 307a,b in FIG. 3A and area 307c in FIGS. 3B and 3D represent partially covered holes (pockets) in the card body for the molding material to bind and find purchase. FIG. 3B depicts the completed molded card in which the insert molded material of molded component 310 is visible. Although the insert molded material is shown contrasting with the background card materials for purposes of illustration, the molded component is not limited to any particular degree of contrast in coloration or shading relative to the background card, and may comprise the same materials as the front of the card or may comprise materials selected to have a coloration or shading selected to match the coloration or shading of the front side of the card so as to minimize its visibility in a completed card. For example, in a card body comprising materials different than the molding materials (e.g. a metal or ceramic body and thermoplastic resin molding materials), the coloration of the molding materials may be selected have a color and tone that matches as closely as possible the material of the body, including using constituents in the molding materials that are the same or similar to the card body materials (e.g. inclusion of a powdered metal in the molding materials that is the same as the metal of the body). In other embodiments, molding materials that contrast with the body of the card may be used. FIG. 3A depicts the front side of a transaction card 300 including an opening 305 which extends entirely through a card body 302. A plurality of securing features 307a, b provide areas to which the molding material can adhere or otherwise bind. In the depicted embodiment, securing features 307a,b are blind holes (e.g., pockets). A similar set of securing features 307c are found on the opposing rear side of transaction card 300 in FIG. 3B. The geometries of opening 305 and securing features 307a, b, c were selected to improve the RF performance of the metal transaction card 300. Securing features 307a, b, c may comprise a material that is the same or otherwise compatible with the molding material, and different than the card body material, such that the molding material and the materials of the securing features melt or otherwise join together with a bond that is relatively stronger than any bond created between the molding material and the card body.

FIG. 3C depicts the front side of the transaction card 300 after an insert molded electronic component 310 has been placed into opening 305. In the depicted embodiment, molded electronic component 310 would be visible on transaction card 300. The geometry of molded electronic component 310 permits molded electronic component 310 to become secured to transaction card 300 through a biasing action created by securing features 307a,b,c. Alternatively, or additionally, molded electronic component 310 may be adhered to opening 305 of transaction card 300 using an epoxy resin such as Bisphenol, Novolac, Aliphatic, and Glycidylamine.

Excess molding material may be removed from molded electronic component 310 (by, e.g., milling or machining) to incorporate additional electronic components or other desired components.

FIG. 4A depicts an exemplary overmolding process in which a pocket 403 is machined into card body 402 for receiving an electronic component 405. In the depicted embodiment electronic component 405 is a printed circuit board (PCB), specifically an RFID module. While pocket 403 is depicted as traversing a substantial portion of the rear face of card body 402, one of ordinary skill in the art will understand the smaller openings of varying geometries may be suitable depending upon the electronic component to be incorporated.

Pocket 403 may be sized to receive and fix into position electronic component 405, or it may be sized to permit excess molding material between the inner lip of pocket 403 and the outer edge of electronic component 405. Electronic component 405 may additionally, or alternatively, be adhered to pocket 403 using an epoxy as described above.

Overmolded faceplate 410 creates the back face of transaction card 400. Overmolded faceplate 410 may completely or partially encapsulate electronic component 405. Overmolded faceplate 410 may be prepared separately and then attached to pocket 403 (using, e.g., a suitable epoxy as described above), or it may be formed by overmolding layers of molding material directly into pocket 403.

In an exemplary embodiment, the molding material used in overmolded faceplate is a plastic material which may enhance RF transmission where transaction card 400 is comprised of a metal or other RF-interfering material.

As is known in the art, transaction cards with RFID chip modules for inductively coupling with a card reader of a point of sale (POS) terminal also typically have an embedded booster antenna structure configured that inductively couples the embedded antenna to the RFID chip module, with the coupled antenna, RFID module, and card reader forming a circuit for transmitting information from the card to the card reader. Thus, in an exemplary embodiment in which the RFID module is the encapsulated or partially encapsulated component (or one of a plurality of electronic components that are processed as described herein), the antenna structure may be provided in any number of ways. In one embodiment, the antenna structure may be embedded in a layer that is applied to the card after the molding processes described herein. The antenna-bearing layer may be laminated to the card using a non-heat process (such as with an adhesive), a heat lamination process conducted at a temperature, pressure, and duration that does not re-melt, deform, or otherwise detrimentally disturb the molding over the electronic component(s), or a backing sheet (comprising metal or some other material not affected by the heat lamination) may be provided during such a heat lamination step to prevent any re-melt or deformation of the molding from protruding from the opposite surface upon which the lamination step is being performed.

In another embodiment, the molding step may comprise an overmolding step that covers not only the electronic component as described herein, but also at least the portion of the card surface into which the antenna structure is to be later disposed. For example, a flood overmolding step may be conducted that, in addition to encapsulating or partially encapsulating the RFID module, also covers at least one entire surface (typically back, but also or instead may be the front) of the card in a layer having a desired thickness. The antenna may then be embedded, such as using ultrasonic processes known in the art, into that overmolded layer. Any content to be printed on the surface of the card may also be printed on the overmolded layer surface, or an additional printing layer may be attached, such as via adhesive or lamination. In other embodiments, the antenna may be printed on the molding surface, or applied as part of another layer that is attached over the molded surface, such as with adhesive or by lamination. The foregoing are non-limiting examples, and it should be understood that infinite possibilities exist for downstream processing of the resulting product of the processes described herein for providing a molded electronic component in a card, and certain aspects of the invention are not limited in any way by later process steps.

Figure 5A:
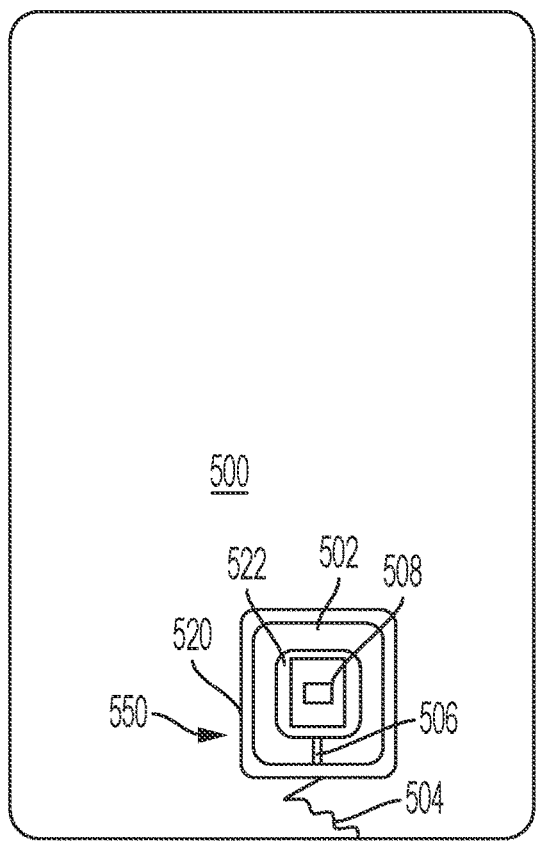
FIG. 5A is an image depicting the front side of an exemplary card having an encapsulated antenna surrounding the payment module.
Figure 5B:
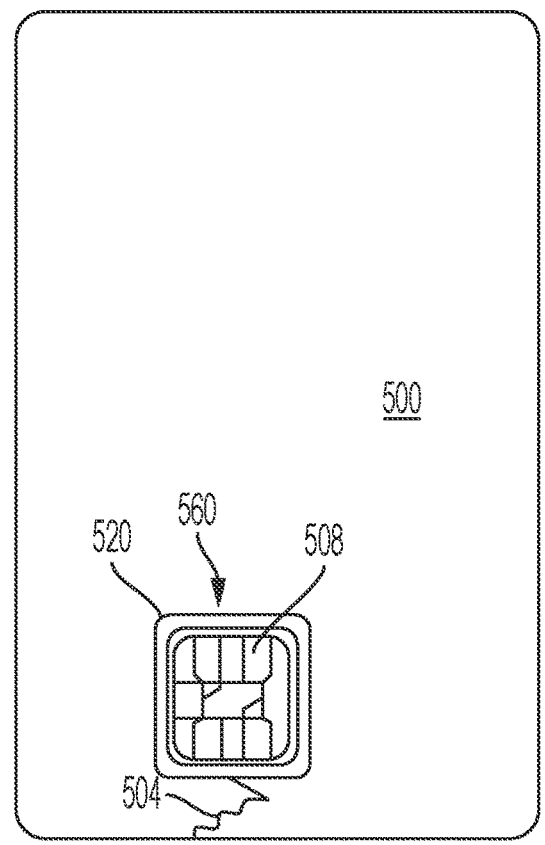
FIG. 5B is an image depicting the back side of the exemplary card of FIG. 5A.
Figure 5C:
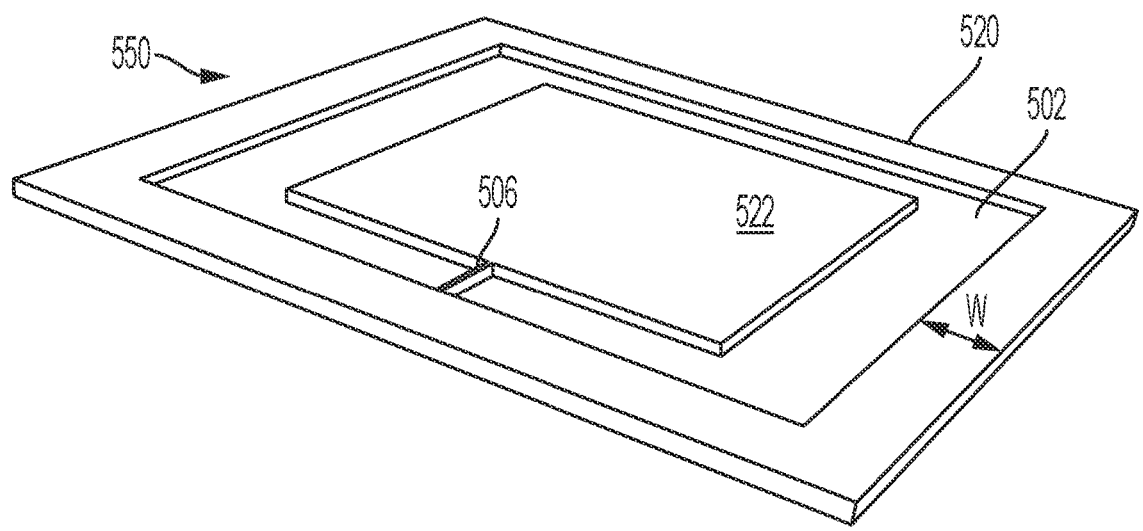
FIG. 5C is an perspective view of an isolated exemplary encapsulated antenna module prior to insertion of the payment module therein.

In another embodiment, illustrated in FIGS. 5A-5C, a booster antenna 502 for inductively coupling with the antenna of a payment module may take the form of an annular metal frame that nearly surrounds the payment module (e.g. a dual interface (DI) RFID chip). As depicted in FIGS. 5A-5C, the antenna has a discontinuity or slit 506 that extends from an inner edge to an outer edge of the annular antenna. Such an antenna has been generally described and characterized as an "amplifier" in U.S. Pat. No. 8,608,082 ('082 Patent) to Le Garrec et al. and a "coupling frame" in U.S. Pat. No. 9,812,782 (and others), to Finn et al., incorporated herein by reference. As described in the foregoing, and in U.S. patent application Ser. No. 15/928,813 (the '813 Application), filed Mar. 22, 2018, titled DI CAPACITIVE EMBEDDED METAL CARD, assigned to the common assignee of the present invention, and incorporated herein by reference, a metal card body itself may serve as such an antenna or amplifier, with a discontinuity (e.g. 504, as depicted in FIGS. 5A and 5B) extending from the periphery of the card to the pocket in which the payment module is mounted. The discontinuity may have any geometry, including but not limited to the stepped shape depicted in FIGS. 5A and 5B, any geometry described in the '813 Application and related applications, or any geometry disclosed in the foregoing references.

The '813 Application also discloses reinforcing a card having discontinuities using a self-supporting layer on the back of the card, such as an FR-4 material (a thermoset laminate made with epoxy resin and woven fiberglass) or polyimide. Printed layers, such as for the various indicia, magnetic stripe, etc., may be assembled with the FR-4 layer or printed directly on the FR-4 layer. For example, the '813 Application describes one embodiment in which a relatively thin (e.g. 0.009 inches thick) stainless steel substrate is used with an FR-4 backing layer, and another embodiment comprising an 18 mil stainless steel layer having a 4 mil FR-4 layer attached to the back side of the steel layer with a 2 mil adhesive layer, a 5 mil printed sheet on the back of the FR-4 layer (attached via another 2 mil adhesive layer), and a 2 mil overlay layer comprising the magnetic stripe laminated to the back side of the print sheet layer. The '813 Application discloses that referable self-supporting (e.g. FR-4) layers have a rigidity of 80 MPa·m$^3$ to 40 GPa·m$^3$.

In some embodiments, described in more detail herein later, a booster antenna may also be provided. In some embodiments, particularly those containing a booster antenna, the metal card body may be isolated from the payment circuit for communicating with a card reader, which circuit contains the transponder module and booster antenna. In such embodiments, the payment circuit may not serve as an antenna or amplifier. In other embodiments, the metal card body may serve together with the booster antenna as part of the payment circuit containing the transponder module. In still other embodiments, the metal card body may be part of a different circuit that harvests energy from the card reader, but may or may not actually communicate with the card reader, such as for example as discussed in more detail in U.S. application Ser. No. 16/751,285, titled METAL, CERAMIC, OR CERAMIC-COATED TRANSACTION CARD WITH WINDOW OR WINDOW PATTERN AND OPTIONAL BACKLIGHTING, filed Jan. 24, 2020, incorporated herein by reference.

As shown in FIG. 5C, metal antenna 502 is surrounded by the encapsulating materials to form an outer surround 520 and an inner region 522, and the encapsulant also fills the slit 506 connecting the inner region to the outer surround. For illustrative purposes, the antenna is depicted in FIG. 5C without encapsulating materials covering it in the Z direction, so that the antenna remains visible in the depiction. In embodiments in which a metal body 500 of the card also is harnessed for signal amplification, the encapsulating material may also fills the slit 504 in the metal body. It should be understood, however, that slit 504 may not be present in all embodiments. It should further be understood that the card body may have more than one slit. Exemplary alternative additional slit locations 554, 564, 574 are depicted in dashed lines. For example, in one embodiment, the combination of slits 504 and 554 intersecting with the chip pocket may form a bisection along the full length of the card, or the combination of slits 564 and 574 intersecting with the chip pocket may together form a bisection along the full width of the card. It should be noted here that the term "bisect" is intended to mean that the line divides the card into two sections, but those sections are not necessarily equal in size. Although depicted generally centered on the antenna aligned to the same line on opposite sides of the antenna, the combined slits may have any relationship to the antenna and to each other, including a relationship wherein the slits on different sides of the antenna lie on parallel or non-parallel lines, relationships in which the slits connect to adjacent rather than opposite sides of the antenna, relationships wherein the slits are not parallel to an edge of the card, or relationships wherein one or both of the slits are non-linear. For embodiments in which the card is bisected, the remaining pieces of the card may be bonded together by overmolding or other nonconductive adhesives or fillers. Although a preferred embodiment includes only a single bisection of the card body into two discrete portions, a plurality of body slits may divide the card into more than two discrete portions. Bisected arrangements, generally, may minimize eddy currents.

Thus, antenna 502 as encapsulated as depicted in FIG. 5C defines a metal containing plug 550, which may either be created in its entirety and then inserted in an opening in the card body, or may be created in situ in the opening in the card body, such as by overmolding. After the plug is inserted in the pocket or molded in situ, a pocket may be created in the inner region 522 of the plug (e.g. by milling or any process known in the art) to receive the payment module. Among the advantages of such a design is that the metal card body may be formed with a through hole for receiving plug 550. Preferably, the through-hole may be formed by methods other than milling, such as stamping, etching, laser cutting, or the like. Or, the card body may be formed initially with a through-hole, which may be particularly advantageous for a card body that is ceramic, cast metal, or metal-doped epoxy (such as is described in PCT Application Ser. No. PCT/US2019/50592, filed Sep. 11, 2019, claiming priority from U.S. Provisional Application Ser. No. 62/730, 282, filed Sep. 12, 2018, titled METAL-DOPED EPOXY RESIN TRANSACTION CARD AND PROCESS FOR MANUFACTURE, assigned to the common assignee of the present application, and incorporated herein by reference). Then, the milling step to create the pocket to receive the payment module need only be performed in a non-metal encapsulating material, which is easier and takes less time to mill than metal. As is known in the art, the pocket for receiving the payment module may be a stepped hole having a first, relatively greater area on the front surface of the card, and a second, relatively lesser area on the back side of the card. By enlarging the area of the pocket in the card body into which the payment module is inserted, the overall length of the slit 504 that must be cut into the metal card body (in embodiments in which the slit is present), can be minimized, also saving manufacturing time. The foregoing improvements foster increased output and efficiency.

In some embodiments, it may not be necessary or desired for the card body to serve as part of the booster antenna. In such embodiments, the opening in the card body may be relatively larger than as depicted in FIGS. 5A-5C, such that outer surround 520 has a width W separating the metal of the antenna 502 in the plug 550 from the card body that is operable to acceptably minimize electrical/magnetic interference from the card body. The geometry of the plug 550 in such embodiments may be more rectangular, with the innermost edge 560 of the plug positioned more towards the center of the card body 500 to guide some of the RF signal towards the center of the card, while the location of the DI payment module remains essentially unchanged as depicted, to conform to the relevant standard for the position of the contacts.

Although described herein in connection with a metal card body, similar geometries may be employed in non-metal cards. In addition to the methods of manufacture described herein, which are suitable for card bodies of any materials (although particularly advantageous for metal, ceramic, and ceramic-coated-metal bodies), antenna 502 may be deployed in a plastic (e.g. PVC) card body, for example, by ultrasonically (or otherwise) embedding the metal component into the plastic as an inlay within the card, thus replacing copper wire or etched antenna inlays. The antenna geometry 502 as depicted can be described as a planar, annular member having a nearly closed periphery, with a slit 506 that connects the inner periphery with the outer periphery of the annulus. Although depicted in the exemplary embodiment as a single member, the antenna structure is not so limited and may comprise more than one member. By contrast, copper wire or etched antenna inlays typically create a spiral pattern of lines or wires with spaces radially separating the whorls of the spiral.

One of ordinary skill in the art will understand that suitable molding materials will depend upon the type of molding process used in step 130. For example, where insert or overmolding is employed, thermoplastic materials such as TechnoMelt® meltable adhesive (Henkel), which may include one or more materials from the group consisting of: EVA, metallocene polyalphaolefins, polyolefins including atactic polyalphaolefins, block copolymers, polyurethane hot melts, epoxy, and polyamides and thermoset materials such as fiberglass reinforced polyester, polyurethane, bakelite, duroplast, melamine, Diallyl-phthalate, and polyimide may be used. One of ordinary skill in the art will understand that other materials which can be rendered flowable in an overmolding or insert molding process may be used as well including, but not limited to, powdered metals such as Rhodium, Aluminum, Titanium, Magnesium, Copper, Brass, Nickel, Monel, Inconel, Steels and alloys of the above, including epoxy containing powdered metals including but not limited to any of the foregoing. Epoxies containing ceramic materials may also be used.

In another embodiment, the molding material used in the overmolding or insert molding process is a plastic material having a molding temperature range of approximately 150-300 C.

FIGS. 6A-6C depict a particular embodiment 600 of a metal RFID device comprising a body in the form of metal frame 610 having an outer periphery 611, an opening in the card body that defines an inner periphery 612 of the metal frame. At least one body discontinuity 620 extends from the outer periphery to the inner periphery of the metal frame. At least one electronic component is disposed in the opening and layers of non-conductive material 640, 642 are disposed about the electronic component. The electronic component comprises an RFID chip 632 disposed in a substrate 634 with an antenna 636, also disposed in the substrate, connected to the RFID chip. Collectively, the RFID chip, antenna, and substrate may be referred to as an RFID module. Thus, RFID device 600 comprises a metal frame 610 having opposite surfaces 614, 615, outer periphery 611 and an opening in the metal frame defining inner periphery 612 and extending from at least one of the opposite surfaces 614, 615 for a depth. As depicted in FIG. 6A-6C, the opening has a depth coexistence with a thickness T of the metal frame from upper surface 614 to lower surface 615. Chip layer 630—comprising a non-conductive substrate 634, RFID transponder chip 632 mounted to substrate 634, and module antenna 636 in the substrate connected to the RFID transponder chip—is disposed inside the opening. The module antenna may be etched or may have any construction known in the art for being disposed in the substrate. One or more fill layers 640, 642 may be disposed in the opening of the frame between the chip layer and one of the surfaces of the metal frame. One or more layers 650, 652 may be laminated over at least one surface of the metal frame. A through-hole 660 extending between the top and bottom surfaces of the device, as depicted in FIG. 6B between the top surface of the top layer 650 and the bottom surface of the bottom layer 652, preferably aligned over a portion of the device located between the inner 611 and outer surfaces 612 of the metal layer. Although shown in FIGS. 6A-6C with both antenna 636 in the chip layer and discontinuity 620 in the metal frame, it should be understood that some components may have only one or the other, but not both, whereas other embodiments may have both, as depicted.

One process of making device 600 may comprise affixing layer 652 to the bottom surface 615 of the metal frame 610 prior to stacking layers 642, 630 and 640 in the opening, and then disposing layer 650 over the opening, and laminating the stack such that layers 640 and 642 envelop chip layer 630. The metal frame may be constructed by cutting the opening in a metal blank, by molding the metal in the desired shape, or by make slicing cross sections from an extruded bar. Although depicted as having dimensions that extend to the inner periphery 612 of metal frame 610, it should be understood that chip layer 630 may have a substantially smaller footprint, such that layers 640 and 642 completely envelop all sides of chip layer 630. Furthermore, it should be understood that an intermediate layer (not shown) of non-conductive material may be disposed between layers 640 and 642, with a cutout for accommodating the periphery of substrate 634, in constructions in which the outer periphery of substrate 634 is less than the inner periphery 612 of the frame.

In another embodiment, depicted in FIGS. 7A-7C, RFID device 700 comprises a metal frame 710 having opposite surfaces 714, 715, outer periphery 711 and an opening in the metal frame defining inner periphery 712 and extending from surfaces 714 for a depth D. As depicted in FIG. 7A-7C, the opening has a depth D that is less than the thickness T of the metal frame from upper surface 714 to lower surface 715. Chip layer 730—comprising substrate 734, RFID transponder chip 732 mounted to substrate 734, and module antenna 736 in the substrate connected to the RFID transponder chip—is disposed inside the opening. Thus, the opening comprises a pocket having a bottom and a ferrite layer 742 disposed between the chip layer and the pocket bottom and fill layer 740 is disposed in the pocket between the chip layer 730 and the top surface 714 of the metal frame. Layer 750 is laminated over top surface 714 of metal frame 710 and over fill layer 740.

One process of making device 700 may comprise making the pocket opening in a metal blank (by milling, etching, laser) to define metal frame 710, stacking layers 742, 730 and 740 in the opening, disposing layer 750 over the opening, and laminating the stacked components together. As depicted in FIGS. 7A-7C, RFID device 700 has a through-hole 760 extending between the top and bottom surfaces of the device, between the top surface of the top layer 750 and the bottom 715 surface of the metal layer as depicted in FIG. 7A, preferably aligned in the portion of the device between the inner 711 and outer surfaces 712 of the metal layer. As further depicted in FIG. 7B (not shown in FIG. 7A or 7C to reduce clutter, and also applicable to the designs of FIGS. 6A-6C and FIGS. 8A-8C, but not shown), hole 760 may be particularly well suited to receive a member 780, such as a component of an apparatus configured to hold one or more keys, such as a key ring or a key chain. Thus, devices 600 and 700 may be a smaller size than that typically associated with a credit card, and more befitting of a size suitable to serve as a key fob or key tag.

While FIGS. 6A-6C and 7A-7C depict contactless-only RFID devices, it should be understood, that the RFID device in any of the foregoing may be a dual interface device capable of interfacing with both contactless and contact-based readers. Thus, as depicted in in FIGS. 8A-8C, RFID device 800 comprises a metal frame 810 having opposite surfaces 814, 815, outer periphery 811 and an opening in the metal frame defining inner periphery 812 and extending from surface 814 for a depth. Chip layer 830—comprising substrate 834, RFID transponder chip 832 mounted to substrate 834, and module antenna 836 in the substrate connected to the RFID transponder chip—is disposed inside the opening. In the embodiment depicted in FIG. 8B in which the opening comprises a pocket having a bottom, a ferrite layer 842 is disposed between the chip layer and the pocket bottom, with fill layer 840 disposed in the pocket between the chip layer 830 and the top surface 814 of the metal frame. Layer 850 is laminated over top surface 814 of metal frame 810 and over fill layer 840. DI chip, because it has contact-based functionality, extends to the top surface of upper layer 850.

One process of making device 800 may comprise making the pocket opening in a metal blank (by milling, etching, laser) to define metal frame 810, stacking layers 842, 830 and 840 (having a cutout to accommodate chip 832) in the opening, disposing layer 850 (with a cutout to accommodate chip 832) over the opening, and laminating the stacked components together. In another embodiment, only antenna 836 may be present on substrate 830 when the stack of layers 842, 830, 840 and 850 are laminated together, and then a hole for receiving chip 832 is created and chip 832 is inserted. A subsequent lamination step may be performed at a temperature suitable to reflow the meltable layers to encapsulate all but the top contact surface of chip 832.

Although depicted as a pocket with a depth less than the thickness of the metal frame in FIG. 8B, it should be understood that DI chip (or contact only) designs may also be suitable for use with designs in which the opening extends the full thickness of the metal frame, such as the embodiment depicted in FIGS. 6A-6C. Furthermore, permutations of such embodiments include those with only an antenna 836, those with an antenna 836 and a slit similar to slit 620, and those with both an antenna and a slit.

To maintain functionality in standard card-readers meant for credit-card sized payment devices, the orientation (with short edge of the contact pad of chip 832 parallel to leading edge 870 of the device) of DI chip, location (left of center) of DI chip 832, and the dimensions of metal frame 810, are identical to that of the left-most portion of a standard DI credit card (viewed from the front or top surface of the card). Such a construction permits the device to be inserted in the direction of arrow P into a contact-based card reader, oriented leading edge 870 first, making device 800 indistinguishable from a standard credit card from the perspective of the card reader.

While none of the embodiments 600, 700, 800 are limited to any particular location for the through-hole for accommodating a component of a key carrier, it should be understood that in DI (or contact-only) devices, the hole should be located where it does not cause interference with insertion in the card reader. While a location in the upper left or upper right hand corners of the device (e.g. where hole 860a is shown in FIG. 8A), may be acceptable, the overall dimensions of the device in the card insertion direction may be reduced in constructions in which the hole is located on an appendage 874 that protrudes from the trailing edge 872 of the card, such as in the location where hole 860b is depicted in FIG. 8A. Although semicircular in geometry as depicted in FIG. 8A, appendage 874 may have any geometry desired. While only a single through-hole may be needed per device, some devices may have more than one. Although depicted with through-holes 660, 760, 860a, 860b in particular locations in the drawings, the hole may be in any location that does not interfere with the functional elements of the device (or intended uses of the device, e.g., for use in a card reader, for contact inclusive modules). Locations in the metal corners of the frame, however, may be particular desirable.

Although depicted as rectangular, it should be understood that devices 600, 700, 800 may have any geometry desired (most particularly device 600 and 700 not depicted with contact function). Although device 800 requires a geometry for insertion in a card reader in relevant portions, its overall geometry is not limited.

Although described herein in specific embodiments comprising an opening and non-conductive laminated layers and/or substrate surrounding the RFID transceiver chip, it should be understood that the RFID chip and/or the antenna may be encapsulated using any of the techniques described herein. Furthermore, although the discussion of some embodiments herein refer to "cards" and others refer to "devices" suitable for use on a key holder, it should be understood that any of the designs as disclosed herein may be suitable for use in any size, not limited to either standard transaction card size or to smaller sizes intended for attachment to a key holder. As is known in the art, a standard transaction card (e.g. credit, debit, gift cards) conforms to the CR80 or ISO/IEC 7810:2003 standards, and has nominal dimensions of approximately 3.5 inches by 2 inches, or more specifically 3.37 inches (85.6 mm) by 2.125 (53.98 mm), 0.03125 inches (0.76 millimeters) thick, with rounded corners having a radius of 3.18 millimeters. As is understood by those in the art, the foregoing dimensions are nominal dimensions having a tolerance range for each. Although referred to herein as a "key holder," it should be understood that the devices with through-holes as discussed herein may be attached to any type of member suitable for passing through the hole, with or without keys attached to that same member, including chains, rings, lanyards, ropes, necklaces, bracelets, posts, etc.

In yet another embodiment, depicted in FIGS. 9A-9C, the card includes a metal layer 950, which may be formed from a metal foil, metal sheet, bulk metal, or other known metal. Metal layer 950 may comprise a plurality of discontinuities extending from the front surface 902 to the back surface 904 of the metal layer, including at least a first discontinuity 920 that defines a path from the card periphery to opening 912 in the metal layer for receiving the transponder chip module 910. In the embodiment depicted in FIGS. 9A-9C, other discontinuities 922, 924, 928 extend from the periphery to an endpoint that does not coincide with the opening 912. Another discontinuity 926 extends from an intersection with discontinuity 920 to an endpoint that is neither in the opening nor at the periphery. Metal layer 950 may additionally comprise additional discontinuities, such as a second discontinuity that defines a path from the card periphery to opening (not shown in FIGS. 9A-9C, but akin to the respective combinations of slits 504 and 554 or slits 564 and 574 depicted in FIG. 5A) and bisects the card into two discrete portions. The discontinuities may have any shape, and may include discontinuities that are incorporated into aspects of the aesthetic design on one or both faces of the card, including in coordination with printed features, or formed in the shape of alphanumeric characters, symbols, or the like.

In the embodiment depicted in FIG. 9C, a booster antenna layer 942 comprises a plurality of metallizations 940, 944 on a substrate (e.g. polyester) that form a booster antenna. Suitable booster antennas may also comprise a metal wire antenna disposed on a non-metal substrate. The metal portions of the antenna are isolated from the metal layer 950 by glue layer 952 separating the booster antenna and the metal layer. Booster antenna 942 is configured for communication with the transponder chip module 910, and the transponder chip module 910 and the booster antenna 942 both comprise components in a circuit configured for wireless communication with a card reader (not shown). The booster antenna may be connected to the transponder chip module inductively, or with physical connections (e.g. wires, traces, or contacts). In exemplary embodiments, booster antennal layer 942 comprises a solid polyester layer (e.g. approximately 25 microns thick), which may be asymmetrically metalized on both sides, with vias through the polyester connecting respective metallizations disposed on opposite surfaces.

Reinforcing layer 982, such as fiberglass-reinforced epoxy laminate, such as FR-4, is disposed over the front surface 902 of metal layer 950, and a reinforcing layer 984 of similar construction is disposed over the back surface 904 of the metal layer 950 and over the booster antenna layer 942. The reinforcing layer is not limited to any particular type of glass-reinforced epoxy laminate material, however, including both flame retardant (hence the designation "FR") and non-flame-retardant glass-reinforced epoxy laminates. The term "FR-4" may be used herein as shorthand to refer to a reinforcing layer of any construction, including but not limited to flame retardant and non-flame-retardant fiber-reinforced epoxy laminates. The fibers in fiber-reinforced laminates may comprise fiberglass, polymeric fibers, or any other type of fiber known in the art for making fiber-reinforced structures. The term "fiber" as used herein may include any type of structure that includes fibers or filamentary members, including mesh or grid structures, woven structures, structures with randomly oriented fibers, or the like, without limitation. The FR-4 layers may be adhered to the respective layers by adhesive layers 981 and 983. The adhesive from the adhesive layers may penetrate and partially or entirely fill the discontinuities 924, 926, 928 during formation of the card. In some embodiments (not shown), antenna layer 942 and FR-4 layer 984 may be inverted, with layer 984 as the outermost layer, with printed matter printed directly onto the outer printed sheet layer. It should be understood that in embodiments in which the antenna layer is adjacent the metal layer, the metallizations of the antenna are disposed on the opposite surface of the antenna substrate from the metal layer, or an insulating material (e.g. adhesive and/or a non-metal layer, such as adhesive disposed on a non-metal substrate) is disposed between the metallizations and the metal layer. In other embodiments, the metallizations may be embedded in the FR-4 layers, such as using ultrasound techniques.

Although the term "metallizations" may typically be understood to refer to coatings on the outside surface of a substrate, as used throughout this application, the term refers to any type of metal structure, and when referring to a booster antenna structure, refers to the metal construct of the antenna, regardless of form, including but not limited to structures created using etched films, coatings, depositions, printing, embedded wire, and the like.

Disposed above upper FR-4 layer 982, such as adhered by adhesive layer 991, is disposed an optional, RF-friendly metal foil 990 (preferably configured with a metallic appearance), over which is adhered a plastic layer 994 (attached by adhesive 993). Notably, the adhesive layers may be preformed together with the foil as a composite, and the foil composite hot stamped onto the FR-4, or rolled onto the FR-4. In embodiments in which the foil is rolled on, the foil composite may comprise a release layer that is them removed before attaching the next layer. Printed content 995 is disposed on plastic layer 994. In other embodiments, the printed content may be printed directly on the foil 990, and the plastic layer 994/adhesive 993 omitted. Other printed content 996 and/or a magnetic stripe (not shown) may be disposed on lower FR-4 layer 986. Embodiments in which the position of layers 994 and 990 in the stack are inverted relative to one another (e.g. in switched positions so that layer 900 is located relatively higher in the stack than layer 994) may also be provided.

In the embodiment depicted in FIG. 9C, opening 912 extends through all of the upper layers of the composite card such that a contact surface 911 of transponder module 910 is accessible from the top surface of the card. Such a construction is preferred in embodiments in which the transponder module is has contacts configured to be physically contacted by a card reader, such as a dual interface (DI) module. Constructions incorporating contactless-only modules may also be provided, however, in which the opening 912 does not extend to the top surface of the card. Opening 912 may be filled with a non-metal plug 913 that isolates the transponder module from the metal layer. Plug 913 may have a hole 915 in the bottom for receiving a downward protruding region 914 of the transponder module having a relatively smaller periphery than the periphery of the widest portion of the module. The configuration of the plug in the metal layer may be in accordance with the teachings in U.S. Pat. No. 9,390,366, titled "METAL SMART CARD WITH DUAL INTERFACE CAPABILITY" and/or U.S. Pat. No. 10,318,859, titled DUAL INTERFACE METAL SMART CARD WITH BOOSTER ANTENNA, or applications related thereto, incorporated herein by reference.

While not limited to any particular dimensions, an exemplary embodiment of the aspect of the invention depicted in FIG. 9C may include the exemplary thicknesses and compositions as set forth in Table 1:

TABLE 1

| Layer (Element number) | Thickness (inches) |
| --- | --- |
| Ink (995) | 0.0005-0.002 |
| Plastic (994) | 0.001-0.002 |
| Adhesive (993) | 0.001-0.003 |
| Foil (990) | ~0.0005 (1-12 um) |
| Adhesive (991)* | 0.001-0.003 |
| FR-4 layer (982) | 0.002-0.004 |
| Adhesive (981)* | 0.001-0.003 |
| Metal (950) | 0.01-0.02 |
| Adhesive (952)* | 0.001-0.003 |
| FR-4 (984) | 0.002-0.004 |
| Adhesive (985)* | 0.001-0.003 |
| Antenna (942) | 0.001-0.003 |
| Plastic (997) | 0.001-0.007 |
| Ink (996) | Negligible-0.002 |

*optional (see below)

Although depicted in FIG. 9C, it should be understood that in many of the interfaces between layers, the adhesive layer may be optional (or may not be a discrete layer relative to the layers above or below). For example, as described herein, the FR-4 layers may be cast directly onto the metal layer. Non-metal layers may be laminated together in a way in which the material of the layer bonds to the adjacent layer(s) with or without adhesive. The antenna layer may be a discrete, self-supporting layer, or may comprise metallizations disposed directly on the FR-4, such as via metal foil that is etched, printed with metal ink, or wire embedded (e.g. ultrasonically) into the FR-4 layer, as described further herein. In embodiments in which foil 990 is a "transfer foil," adhesive layer 991 is optional or may represent an adhesive layer integral to the matrix of the transfer foil 990 that bonds directly to the underlying layer. The positions in the stack of antenna layer 942 and FR-4 layer 984 may be inverted relative to one another, in which case plastic layer 997 may be omitted and ink layer 996 printed directly on FR-4 layer 984. Notably, the foregoing expresses only one embodiment, and other embodiments may contain more or fewer layers.

In the embodiment depicted in FIGS. 9A-9C, booster antenna layer 942 includes a plurality of nested semicircular metallizations 944, which concentrate induction, for facilitating inductive coupling to transponder module 910. While shown with inductive coupling, in other arrangements, the booster antenna may have a physical connection to the transponder module.

Magnetic stripe 930 may be disposed over the bottom FR-4 layer 984. Other card features, such as holograms, printing, 2-D codes (such as bar codes or QR codes) may also be incorporated in the card design, typically disposed over the bottom FR-4 layer or on the top plastic layer.

Figure 10:
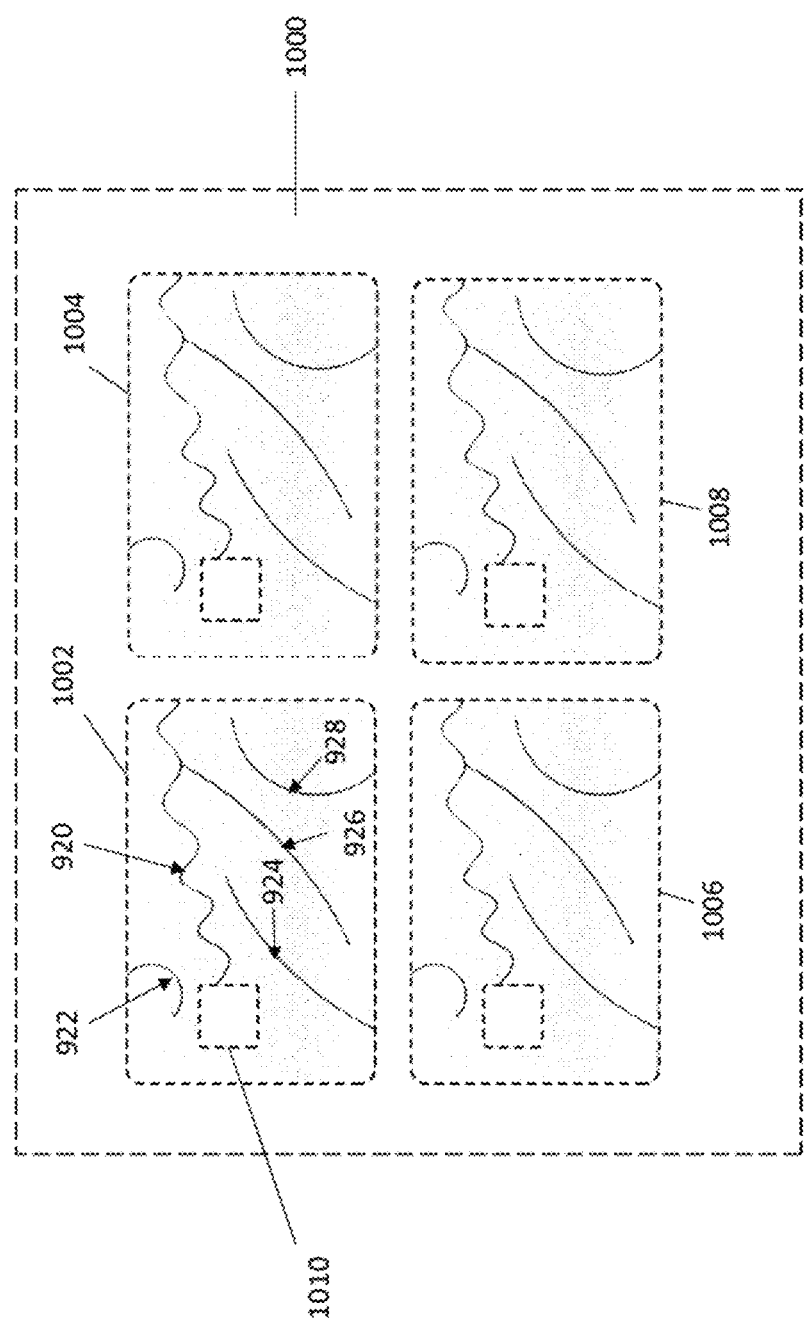
FIG. 10 depicts an exemplary process for making a transaction card.

Referring now to FIG. 10, an exemplary process for making a card as described herein, such as for example the embodiment depicted in FIGS. 9A-9B, may include first providing a sheet of metal 1000 that serves as metal layer 950 in the cross-sections as illustrated herein. The sheet is sized to be cut into a plurality of cards along lines 1002, 1004, 1006, 1008. While FIG. 10 depicts only a portion of a sheet having only four cards, it should be understood that the sheet may be sized for cutting into any number of cards. What is important, regardless of the number of cards per sheet, is that the size of the sheet is preferably greater than the size of the card or cards to be cut from the sheet, so that when the sheet is sliced to form the desired discontinuities, the sheet remains intact.

The sheet may be inserted into a mold with layers of fiberglass or plastic mesh disposed over the metal layers, and then epoxy allowed to fill the mold, thereby casting epoxy over the top and/or bottom surfaces of the metal sheet to form FR-4 layers 982, 984 directly bonded to the metal layer, such in the embodiment depicted in FIG. 9E. In other embodiments, pre-formed FR-4 layers 982, 984 may be adhesively bonded to the top and/or bottom surfaces of the metal sheet, such as in the embodiment depicted in FIG. 9F.

More or fewer layers may be provided than are shown in FIGS. 9E and 9F, including but not limited to layers described with respect to other embodiments herein. Likewise, more or fewer layers may be provided for any of the other embodiments discussed in any section of this disclosure. Similar element numbers for the various layers shown in FIGS. 9E and 9F are intended to refer layers with the same function and/or constructions as those referenced by the same number in other drawings, but the functions, layers, and locations in any of the depicted embodiments, are not limited to the arrangements shown. Those of skill in the art will recognize that a number of different arrangements are possible; however, certain of the embodiments as discussed herein may be particularly advantageous with respect to considerations of cost, durability, aesthetics, thickness minimization, or the like. The thicknesses of the layers as depicted in any of the figures should not be interpreted as an indication of relative thickness of the layers in actual constructions, as certain features may be highlighted or enhanced in the figures for illustration only.

Metallization 940 for the booster antenna may be included in the stack as part of a discrete layer (e.g. 942) as depicted in FIGS. 9C and 9D, or may be disposed directly on or embedded beneath (not shown) one of the surfaces of the FR-4 layers, as depicted in FIGS. 9E and 9F. One process for making an etched booster antenna layer typically comprises adhesively attaching a metal (e.g. copper) foil layer to one surface of the FR-4 layer, and then etching away unwanted portions of the foil to leave the desired antenna pattern. Other ways of disposing the antenna directly on or into the FR-4 include pattern vapor deposition, printing with conductive ink, and embedding copper wire into the FR-4 (such as using ultrasonic methods known in the art).

In embodiments in which a pre-formed layer of FR-4 is adhesively bonded to the metal layer, the directly-disposed antenna may be disposed on the inside surface of the FR-4, and attached to the metal layer with a sufficient layer of adhesive (such as with layer 960, comprising adhesive layers 962, 964 disposed on opposite surfaces of a non-metal substrate 966) to insulate the metallizations 940 from the metal layer 950, as depicted in FIG. 9F. In embodiments in which the metallizations for the antenna comprise wire embedded in the FR-4, such insulating layers may be omitted. In other embodiments, including those in which the FR-4 layers are directly cast onto the metal layer, such as in the embodiment depicted in FIG. 9E, the metallizations 940 for the antenna may be formed on the outer surface of the FR-4 layer 984, and covered with another non-metal layer 997*e*. Embodiments in which one FR-4 layer is directly cast, and the other attached later may also be provided. Embodiments with a metallized FR-4 layer added to the metal as a discrete layer, instead of directly cast to the metal, may have metallizations on both sides of the FR-4 (optionally, connected with vias through the FR-4 layer), in which case the construction as depicted in FIG. 9F may include additional layer 997*e* on the outer surface of layer 984, as depicted in FIG. 9E. The covering layer 997*e* is typically an opaque plastic layer, such as plastic laminated (as depicted in FIG. 9F) or adhesively bonded to the FR-4 layer (not shown), but the outer layer may have any construction, particularly when adhesively bonded to the FR-4, including but not limited to a decorative layer of ceramic, wood, leather, or even another layer of metal, such as anodized metal. In embodiments in which the metallizations for the antenna comprise wire embedded in the FR-4, the additional non-metal layer 997 may be omitted, insulation may be omitted.

Openings 1010 for accommodating the transponder module (corresponding to opening 912 shown in other figures) may be milled in part or in whole into the metal sheet depicted in FIG. 10 at any time during the assembly process. For example, the metal may be precut prior to a step of directly casting the metal layer in epoxy to form the FR-4, so that epoxy fills the opening in the metal. In such configurations, the opening in the metal may be sufficiently larger than the transponder to form a plug that can be milled at a later step for receiving the module, with epoxy disposed between the transponder and the metal (and adhesive disposed between the transponder and the epoxy). In embodiments wherein pre-formed FR-4 layers are adhered to the metal, the metal may be cut at the same time as the discontinuities, and the remaining layers may have pre-cut holes that register with the holes in the metal, or the opening 1010 in the metal may be milled after the remaining layers are added, or the opening may be precut in the metal, and milled in the other layers in a later step.

The step of inserting the transponder in the opening may include inserting a plug of non-metal material in the opening that surrounds the transponder. The non-metal material plug may comprise adhesive, or a combination of adhesive and another non-metal substance. In one embodiment, the plug and transponder may be pre-assembled and adhesively bonded in the opening. In another embodiment, the plug may be placed in the opening first, and then milled to accommodate the transponder. The transponder interface with the opening and process for creating it is not limited to any particular construction.

After the stack of layers has been assembled and the transponder modules inserted, the sheet of cards may then be cut into a plurality of individual card blanks, and the individual card blanks further processed, including personalization, as needed. It should be understood that the transaction card of any of the embodiments discussed herein may be of any shape and size, including in a key fob configuration, as described herein with respect to FIGS. 8A-8B

It should be understood that although various concepts have been illustrated using specific exemplary embodiments, the features of each of the embodiments may be mixed and matched as desired by those of skill in the art. For example, the FR-4 and multi-discontinuity architecture as described with respect to FIGS. 9A-9C may be applied to a keychain embodiment, such as that illustrated in FIGS. 6A-8A. Likewise, aspects of the construction—in particular, the absence of the metal layer from the payment circuit—as described herein with reference to FIGS. 9A-9C in a fiber-reinforced epoxy embodiment, may also be featured in other constructions known in the art, without limitation, including but not limited to constructions using other types of overmolding materials or laminated layers, alone or in combination.

The foregoing embodiment is only an exemplary embodiment, and other embodiments may include fewer or more layers, stacked in a different order, and attached to one another by any way known in the art, not limited to adhesive connections. One or more of the functional layers may be formed from a sheet coated with adhesive and a peel-away release layer. In other embodiments, the glue layers may comprise glue disposed on both sides of a very thin sheet of polyester, with release layers disposed over both glue layers. In such embodiments, the relevant steps in a process for forming the card comprise removing a first release layer, attaching the exposed glue layer to an adjacent layer, and then removing the second release layer for attachment of a subsequent layer.

In the exemplary embodiment depicted in FIG. 9D, an exemplary card may be formed from a premade laminate material comprising metal layer 950 with an upper FR-4 layer 982 and a lower FR-4 layer 984 attached to both surfaces thereof, such as may be formed by casting epoxy about a structural mesh placed over the metal layer. In one method for assembling the card, the premade laminate as described above is processed to create discontinuities 924, 926, and 928 and opening 912, from the bottom of the card. For example, a laser may be used for cutting from the lower FR-4 984 layer through the metal layer 950 without penetrating the upper FR-4 layer, thereby leaving the upper FR-4 layer 982 with sufficient integrity to provide reinforcement for the card with the corresponding discontinuities. Additional layers may be added, as described herein in any embodiment, not limited to the stack depicted in FIG. 9D. For example, RF-friendly foil 990 may be disposed over the premade laminate by a rolling or hot-stamp process, as described herein above, the remaining non-ink layers (e.g. booster antenna layer 942, optional lower plastic layer 997, and any adhesive layers 983, 985, between adjacent layers) added, and then the stack laminated. Graphics layers 995 or 996 are printed on the outer surfaces of the laminated stack. The transponder module may be added before or after printing, including milling the opening 912, inserting plug 913 in the opening 912, milling an opening in the plug, and inserting the module 910 in the plug. The plug and module may comprise a pre-made assembly, or may be assembled in situ. It should be understood that the combination, sequence of layers in a stack, and methods for attaching layers to one another (e.g. with adhesive, or by lamination without adhesive between certain adjacent layers, depending upon composition of the layers) may be varied in any way known in the art.

One method of assembling the layers as depicted in the embodiments disclosed herein may include creating the metal layer with discontinues and the opening for receiving the transponder module and separately preparing an FR-4 layer without metallizations, and an FR-4 layer with an etched metallized antenna, and adhesively sandwiching the metal layer between the FR-4 layers, resulting in the structure comprising layers 982, 960, 950, 960, 940, 984 as depicted in FIG. 9F. The FR-4 layer disposed on the top surface of the metal may have a pre-cut opening that aligns with the opening in the metal layer for the transponder module, or the FR-4 layer may be milled after attachment to the metal layer to extend the opening to the top surface of the FR-4 layer. The plug is then disposed in the opening, other non-ink layers (e.g. plastic layers over one or both of the FR-4 layers) are added, and the card is laminated together.

In another embodiment, the process may include providing a premade laminate of FR-4 on both sides of metal (e.g. layers 982, 950, 984 as depicted in FIG. 9E), and then creating opening 912 and one or more discontinuities (e.g. 920, 922, 924, 926, and 928) in the premade laminate. If desired, the discontinuities may be formed so that they penetrate only layer 984 and 950, but not layer 982 (as shown in FIG. 9D). In still another embodiment, the process may include providing the metal body 950, creating opening 912 and one or more discontinuities (e.g. 920, 922, 924, 926, and 928), placing mesh layers on the opposite surfaces of the metal layer, then casting epoxy over the mesh layers to form FR-4 layers 982, 984 bonded to metal layer 950. The resulting layers 982, 950, 984 formed by either of the foregoing processes are then further processed, such as by placing a copper foil on one side of the FR-4, and unwanted portions etched away to form metallization 940. Notably, when starting with a premade laminate with discontinuities penetrating only one FR-4 layer and the metal layer (as depicted in FIG. 9D), the foil is preferably disposed on the FR-4 layer that does not have discontinuities. In the alternative, the discontinuities may be filled (such as with a coating or another non-metal layer) prior to forming the metallizations. The foregoing preferences may be more desirable for etched or printed metallizations, to optimize integrity of the metallizations, than for embedded wire metallizations, which may be disposed in either FR-4 layer with fewer technical concerns. Layer 997e is added to cover the metallization (particularly in embodiments in which the metallization is exposed on the outside of the FR-4, resulting in the composition of layers 982, 950, 940, 984, 997e as depicted in FIG. 9E. Additional layers, including but not limited to layers 995 and 996 may optionally be included, as further described herein.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A transaction device comprising:
   a metal layer having a front surface, a back surface, a periphery, an opening in the metal layer, and one or more discontinuities in the metal layer, each discontinuity comprising a gap in the metal layer extending from the front surface to the back surface, including at least one discontinuity that defines a path from the device periphery to the opening;
   a transponder chip module disposed in the opening in the metal layer; and
   a booster antenna in communication with the transponder chip module, the transponder chip module and the booster antenna comprising components in a circuit configured for wireless communication with a device reader, wherein the metal layer is neither part of the booster antenna nor a component in the circuit.

2. The device of claim 1, comprising at least two body discontinuities defining respective paths from the device periphery to the opening, wherein the at least two body discontinuities and the opening collectively bisect the device body into at least two discrete portions.

3. The device of claim 1, further comprising a non-metal molding material in the one or more discontinuities in the metal layer.

4. The device of claim 3, wherein the non-metal molding material comprises an adhesive or an epoxy.

5. The device of claim 3, further comprising a reinforcing layer disposed over the metal layer.

6. The device of claim 5, wherein the reinforcing layer comprises fiberglass.

7. The device of claim 6, wherein the reinforcing layer comprises a fiber-reinforced epoxy laminate material.

8. The device of claim 6, comprising a fiber-reinforced epoxy laminate material layer disposed on at least one of the front surface and the back surface of the metal layer.

9. The device of claim 8, wherein the metal layer is sandwiched between opposite fiber-reinforced epoxy laminate material layers.

10. The device of claim 9, further comprising a layer of RF-friendly metal foil layer disposed over one of the fiber-reinforced epoxy laminate material layers.

11. The device of claim 10, further comprising the booster antenna layer disposed over the other of the fiber-reinforced epoxy laminate material layers or disposed between the metal layer and the other of the fiber-reinforced epoxy laminate material layers.

12. The device of claim 11, further comprising ink on at least one of the outer surfaces of the device.

13. The device of claim 1, comprising at least one discontinuity in the metal layer extending from the device periphery to a location other than in the opening.

14. The device of claim 1, wherein at least two of the plurality of discontinuities in the metal layer intersect with one another.

15. The device of claim 14, wherein the intersecting discontinuities comprise a first discontinuity defining a path from the device periphery to the opening and a second discontinuity extending from an intersection with the first discontinuity to an endpoint that is neither in the opening nor at the periphery.

16. The device of claim 1, wherein the booster antenna comprises a booster antenna layer comprising a plurality of metallizations.

17. The device of claim 16, each of the plurality of metallizations is electrically isolated from the metal layer.

18. The device of claim 1, comprising a magnetic stripe disposed on a back layer of the device.

19. The device of claim 1, comprising a first fiber-reinforced epoxy laminate material layer over a top surface of the metal layer, but not over the transponder chip module in the opening.

20. The device of claim 19, comprising a second fiber-reinforced epoxy laminate material layer over a bottom surface of the metal layer, including over the opening and over the booster antenna.

21. The device of claim 20, further comprising a magnetic stripe disposed over the booster antenna.

22. The device of claim 1, wherein the device comprises a transaction card conforming to at least one of CR80 or ISO/IEC 7810:2003 standards.

23. The device of claim 1, further comprising a hole extending between a top surface and a bottom surface of the device, the hole sized to receive a ring member configured for holding one or more keys.

24. The device of claim 23, wherein the device comprises a component of a key ring or key chain, further comprising the ring member disposed in the hole.

25. The device of claim 1, wherein the transponder chip module comprises a dual interface module.

26. The device of claim 1, further comprising a layer of RF-friendly metal foil layer disposed over the metal layer.

27. A transaction device comprising:
a metal layer having a front surface, a back surface, a periphery, and one or more discontinuities in the metal layer, each discontinuity comprising a gap in the metal layer extending from the front surface to the back surface, including at least one discontinuity extending to the periphery of the metal layer;
a first non-metal, reinforcing layer disposed over the front surface of the metal layer;
a booster antenna disposed over the back surface of the metal layer, the booster antenna comprising a plurality of metallizations isolated from the metal layer;
a second non-metal, reinforcing layer disposed over the back surface of the metal layer;
an opening in the metal layer extending through the first non-metal, reinforcing layer;
a transponder chip module disposed in the opening, the transponder chip module in communication with the booster antenna and together with the booster antenna comprising a payment circuit configured for wireless communication with a device reader.

28. The transaction device of claim 27, wherein at least a first one of the discontinuities extends from the periphery to the opening in the metal layer.

29. The transaction device of claim 28, wherein at least second one of the discontinuities extends from the periphery to an endpoint not in the opening in the metal layer.

30. The transaction device of claim 29, wherein at least a third one of the discontinuities extends from an intersection with the first discontinuity to and endpoint that is neither in the opening nor at the periphery.

31. The transaction device of claim 27, wherein the metal layer is electrically isolated from the payment circuit.

32. The transaction device of claim 27, wherein the metal layer is part of the payment circuit.

33. The transaction device of claim 27, wherein the first non-metal layer and the second non-metal layer each comprise fiber-reinforced epoxy laminate material.

34. A transaction device comprising:
a metal layer having a front surface, a back surface, and a periphery;
an opening in the metal layer extending from the metal layer to a top surface of the device;
one or more discontinuities in the metal layer, each discontinuity comprising a gap in the metal layer extending from the front surface to the back surface, including at least one discontinuity extending between the periphery of the metal layer and the opening in the metal layer;
a back fiber-reinforced epoxy laminate material layer disposed over the back surface of the metal layer;
a booster antenna;
a transponder chip module disposed in the opening and having a top surface accessible from the top surface of the device, the transponder chip module in communication with the booster antenna and together with the booster antenna comprising a payment circuit configured for wireless communication with a device reader.

35. The device of claim 34, wherein the booster antenna comprises the metal layer.

36. The device of claim 34, comprising a booster antenna separate from the metal layer, wherein the metal layer is isolated from the payment circuit.

37. The device of claim 34, further comprising a front fiber-reinforced epoxy laminate material layer disposed over the front side of the metal layer.

38. The device of claim 37, wherein the front and back fiber-reinforced epoxy laminate material layers are each bonded directly to the metal layer by the epoxy of the front and back fiber-reinforced epoxy laminate material layers.

39. The device of claim 37, wherein the respective fiber-reinforced epoxy laminate material layers disposed over the front side and back side of the metal layer are discrete layers that are bonded to the metal layer by an adhesive other than the epoxy of the fiber-reinforced epoxy laminate material layers.

40. The device of claim 39, wherein the metal layer is electrically isolated from the payment circuit and the booster antenna comprises a plurality of metallizations on or embedded in the back fiber-reinforced epoxy laminate material layer.

41. The device of claim 40, wherein at least a portion of the plurality of metallizations are disposed on a back surface of the back fiber-reinforced epoxy laminate material layer and the device includes a non-metal layer disposed over the plurality of metallizations.

42. The device of claim 40, wherein at least a portion of the plurality of metallizations are disposed on a front surface of the back fiber-reinforced epoxy laminate material layer and separated from the metal layer by a non-metal layer disposed between the fiber-reinforced epoxy laminate material layer and the metal layer.

43. The device of claim 42, wherein the non-metal layer comprises a substrate of an adhesive layer.

44. The device of claim 34, wherein the metal layer is isolated from the payment circuit and the booster antenna and comprises a plurality of metallizations on or embedded in the back fiber-reinforced epoxy laminate material layer.

45. The device of claim 44, wherein the plurality of metallizations are disposed on a back surface of the back fiber-reinforced epoxy laminate material layer and the device includes a non-metal layer disposed over the plurality of metallizations.

46. A process for manufacturing a transaction device, the process comprising steps of:
 (a) providing a metal layer having a front surface, a back surface, and a periphery;
 (b) forming one or more discontinuities in the metal layer, each discontinuity comprising a gap in the metal layer extending from the front surface to the back surface, including at least one discontinuity extending to the periphery of the metal layer;
 (c) disposing a booster antenna over the back surface of the metal layer, the booster antenna comprising a plurality of metallizations;
 (d) disposing a first fiberglass layer over the front surface of the metal layer;
 (e) disposing a second fiberglass layer over the back surface of the metal layer;
 (f) forming an opening in the metal layer extending through the first fiberglass layer to a top surface of the device;
 (h) disposing a transponder chip module in the opening.

47. The process of claim 46, comprising configuring the transponder chip module to be in electrical communication with the booster antenna to together form a portion of a payment circuit configured for wireless communication with a device reader.

48. The process of claim 46, including disposing the booster antenna layer over the back surface of the metal layer with the metallizations electrically isolated from the metal layer, and configuring the device with the metal layer not included in the payment circuit.

49. The process of claim 46, wherein the step of disposing the booster antenna over the back surface of the metal layer comprises forming the plurality of metallizations on or embedded in the second fiberglass layer.

50. The process of claim 49, further comprising disposing an additional non-metal layer over the metallizations.

51. The process of claim 46, wherein the steps of disposing the first and second fiberglass layers over the front and back surfaces of the metal layer comprise casting the first and second fiberglass layers with epoxy to form first and second fiber-reinforced epoxy laminate material layers bonded directly to the metal layer.

52. The process of claim 46, wherein the steps of disposing the first and second fiberglass layers over the front and back surfaces of the metal layer comprise attaching a first cured fiber-reinforced epoxy laminate material layer to the front surface of the metal layer with a first adhesive layer and attaching a second cured fiber-reinforced epoxy laminate material layer to the back surface of the metal layer with a second adhesive layer.

53. The process of claim 52, further comprising forming the booster antenna over the back surface of the metal layer by forming a plurality of metallizations on or embedded in the second cured fiber-reinforced epoxy laminate material layer.

54. The process of claim 52, wherein forming the plurality of metallizations comprises embedding wire in the second cured fiber-reinforced epoxy laminate material.

55. The process of claim 52, wherein forming the plurality of metallizations comprises printing metallized ink on a surface of the second cured fiber-reinforced epoxy laminate material.

56. The process of claim 55, comprising forming the plurality of metallizations on an inside surface of the second cured fiber-reinforced epoxy laminate material layer facing the metal layer.

57. The process of claim 56, wherein the second adhesive layer includes a non-metal substrate layer.

58. The process of claim 52, wherein forming the plurality of metallizations comprises disposing a metal layer over the second cured fiber-reinforced epoxy laminate material layer, and etching away a portion of the metal layer to leave the metallizations.

59. The process of claim 55, comprising forming the plurality of metallizations on an outside surface of the second cured fiber-reinforced epoxy laminate material layer facing away from the metal layer.

60. The process of claim 59, comprising disposing a non-metal layer over the outside surface of the second cured fiber-reinforced epoxy laminate material and the plurality of metallizations disposed thereon.

61. The process of claim 46, wherein the opening in the metal layer is created in the same step as the discontinuities in the metal layer.

62. A process for manufacturing a transaction device, the process comprising steps of:
 (a) providing a premade laminate comprising
  a metal layer having a front surface, a back surface, and a periphery;
  a first cured fiber-reinforced epoxy laminate layer bonded to the front surface of the metal layer;
  a second cured fiber-reinforced epoxy laminate layer bonded to the back surface of the metal layer;
 (b) forming one or more discontinuities in the metal layer of the premade laminate, each discontinuity comprising a gap in the metal layer extending from the front surface to the back surface, including at least one discontinuity extending to the periphery of the metal layer, each of the one or more discontinuities also extending through at least one of the first cured fiber-reinforced epoxy laminate layer or the second cured fiber-reinforced epoxy laminate layer;
 (c) disposing a booster antenna over an outer surface of one of the first cured fiber-reinforced epoxy laminate layer or the second cured fiber-reinforced epoxy laminate layer, the booster antenna comprising a plurality of metallizations;

(d) forming an opening in the metal layer extending through the first fiberglass layer to a top surface of the device;

(h) disposing a transponder chip module in the opening.

63. The process of claim 62, further comprising forming the booster antenna by forming a plurality of metallizations on the outer surface of or embedded within one of the first cured fiber-reinforced epoxy laminate layer or the second cured fiber-reinforced epoxy laminate layer.

64. The process of claim 62, wherein forming the plurality of metallizations comprises disposing a metal layer on the outside surface of the respective cured fiber-reinforced epoxy laminate material layer, and etching away a portion of the metal layer to leave the metallizations.

65. The process of claim 62, comprising disposing a non-metal layer over the outside surface of the respective cured fiber-reinforced epoxy laminate material and the plurality of metallizations disposed thereon.

66. The process of claim 62, wherein forming the plurality of metallizations comprises embedding wire in the respective first or second cured fiber-reinforced epoxy laminate layer.

\* \* \* \* \*